(12) United States Patent
Cassuto et al.

(10) Patent No.: US 8,296,623 B2
(45) Date of Patent: Oct. 23, 2012

(54) CODES FOR LIMITED MAGNITUDE ASYMMETRIC ERRORS IN FLASH MEMORIES

(75) Inventors: Yuval Cassuto, Pasadena, CA (US); Jehoshua Bruck, La Canada, CA (US); Moshe Schwartz, Pasadena, CA (US); Vasken Bohossian, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 1204 days.

(21) Appl. No.: 11/969,846

(22) Filed: Jan. 4, 2008

(65) Prior Publication Data

US 2008/0168320 A1 Jul. 10, 2008

Related U.S. Application Data

(60) Provisional application No. 60/878,985, filed on Jan. 5, 2007.

(51) Int. Cl.
*H03M 13/00* (2006.01)
*G11C 29/00* (2006.01)
(52) U.S. Cl. .................................. 714/759; 714/773
(58) Field of Classification Search .................. None
See application file for complete search history.

(56) References Cited

U.S. PATENT DOCUMENTS

| | | | | |
|---|---|---|---|---|
| 3,638,182 | A * | 1/1972 | Burton et al. | 714/761 |
| 6,378,100 | B1 * | 4/2002 | Van Dijk et al. | 714/752 |
| 6,567,302 | B2 * | 5/2003 | Lakhani | 365/185.03 |
| 6,771,197 | B1 * | 8/2004 | Yedidia et al. | 341/107 |
| 7,047,478 | B2 * | 5/2006 | Gregori et al. | 714/773 |
| 7,073,103 | B2 * | 7/2006 | Gongwer et al. | 714/718 |
| 7,697,342 | B2 * | 4/2010 | Byeon et al. | 365/185.25 |
| 2002/0037034 | A1 * | 3/2002 | Penther | 375/229 |
| 2007/0101184 | A1 * | 5/2007 | Norman et al. | 714/5 |

OTHER PUBLICATIONS

Ahlswede, R., et al. "Error control codes for parallel asymmetric channels", *Proc. IEEE International Symposium on Information Theory (ISIT)* (Jul. 9-14, 2006), pp. 1768-1772.

Ahlswede, R., et al. "On q-ary Codes Correcting All Uniderctional Errors of a Limited Magnitude", retrieved from the Internet on Jun. 13, 2008 at URL:http://axiv.org/abs/cs/0607132>, pp. 1-22.

Cassuto, Yuval, et al. "Codes for Multi-Level Flash Memories: Correcting Asymmetric Limited-Magnitude Errors", *Proc. IEEE International Symposium on Information Theory, Nice France* (Jun. 24-29, 2007) pp. 1176-1180.

Kaneko, Haruhiko, et al. "A Class of M-Ary Asmmetric Symbol Error Correcting Codes for Data Entry Devices", *IEEE Transactions on Computers* (Feb. 2004) 53(2):159-167. Kaneko, Haruhiko, et al. "Nonsystematic M-Ary Asymmetric Error Correcting Codes Designed by Multilevel Coding Method", *Proceedings of the 10th IEEE Pacific Rim International Symposium on Dependable Computing, PRDC'04* (Mar. 3-5, 2004), pp. 219-226.

Wörz, T., *Dekodierung von mehrstufiger codierter Modulation*, VDI Verlag, Düsseldorf, (1996), Chapters 2, 3 and 4, pp. 6-49.

* cited by examiner

*Primary Examiner* — Ajay Bhatia
*Assistant Examiner* — Daniel McMahon
(74) *Attorney, Agent, or Firm* — Kilpatrick Townsend & Stockton LLP

(57) ABSTRACT

Error correction is tailored for the use of an ECC for correcting asymmetric errors with low magnitude in a data device, with minimal modifications to the conventional data device architecture. The technique permits error correction and data recovery to be performed with reduced-size error correcting code alphabets. For particular cases, the technique can reduce the problem of constructing codes for correcting limited magnitude asymmetric errors to the problem of constructing codes for symmetric errors over small alphabets. Also described are speed up techniques for reaching target data levels more quickly, using more aggressive memory programming operations.

59 Claims, 16 Drawing Sheets

|                | Sample 1            | Sample 2            |
|----------------|---------------------|---------------------|
|                | codeword            | codeword            |
| (a)            | 3 5 3 1 1           | 4 6 2 2 0           |
|                | corrupted           | corrupted           |
| (b)            | 4 5 3 2 1           | 4 6 3 2 1           |
|                | located             | located             |
| (c)            | 4 5 3 2 1           | 4 6 3 2 1           |
|                | corrected           | corrected           |
| (d)            | 3 5 3 1 1           | 4 6 2 2 0           |

FIG. 1

CODES FOR LIMITED MAGNITUDE ASYMMETRIC ERRORS IN FLASH MEMORIES

CROSS-REFERENCES TO RELATED APPLICATIONS

This application claims the benefit of U.S. Provisional Application Ser. No. 60/878,985 entitled "Codes for Limited Magnitude Asymmetric Errors in Flash Memories" filed Jan. 5, 2007. Priority of the filing date is hereby claimed, and the disclosure of the prior application is hereby incorporated by reference.

BACKGROUND

The present invention relates to memory devices and, more particularly, to error correction in memory devices such as Flash memory devices with multilevel cell architecture.

Memory devices are useful for storing and retrieving data utilized by a wide variety of computing processes and systems. Storing data into a memory device is also described as writing to the device or programming the device. Storing data may involve an erase operation, in which memory locations of the device are first set to a uniform level or value before being set to a desired data value. Retrieving data from a memory device is also described as reading from the device. A memory device may be external to a host machine, such as a memory device that can be accessed by a computer via a data bus connection such as Universal Serial Bus (USB), or a memory device may be incorporated with a host or with a processor device, to provide an integrated device such as a camera, cellular telephone, computer, network storage appliance, communications equipment, system component, and the like.

During read/write or program/erase processes in such memory devices, errors can be introduced, so that data stored into or retrieved from the memory device does not have the intended value. Thus, correction schemes such as error-correcting codes (ECC) have been devised to recover the original information. Generally, an ECC is based upon the idea of adding redundancy to the information such that errors induced by some physical effects are corrected. Many memory devices tend to have symmetric errors, either in large or small magnitude. In fact, the most well-studied model for error correcting codes in an information channel is for errors in a symmetric channel. According to the symmetric channel model, a symbol taken from the code alphabet is changed by an error event to another symbol from the same alphabet, and all such transitions are equally probable. That is, an error event that results in a low symbol changing to a high symbol is as likely as an error event that results in a high symbol changing to a low symbol. The natural error model that corresponds to the symmetric channel is the model of symmetric errors, whereby the Hamming weight is used as a constraint on legal error vectors. The popularity of the symmetric channel model, and the corresponding Hamming error model, stem from their applicability to practical applications, but more so from the powerful construction techniques that have been found to address them. A wide variety of ECC have been developed to correct such symmetric channel errors and are commonly used for a wide range of memory devices.

Asymmetric errors can also be introduced in certain data devices. For example, Flash memory is a non-volatile memory (NVM) technology that is both electrically programmable and electrically erasable. This property, together with high storage densities and high speed programming, has made Flash memory one of the dominant non-volatile memory technologies for many portable applications. In Flash memories, asymmetric errors are caused by programming/erasing processes suited for such devices. This is especially the case with more recent multilevel Flash cell memories. A typical two-level Flash memory represents a single bit of information, set to a zero level or a high level to represent a binary zero or a binary one. Such Flash cells will be referred to as two-level Flash memory cells. A multilevel Flash memory cell utilizes multiple levels to represent multiple bits of information with just a single memory cell. For example, a multilevel cell might use eight levels between the zero level and the high level used by a single level Flash memory cell to represent three bits of information (from 000 to 001 to 010 and so forth to 111).

In conjunction with conventional error processing schemes, data is stored into memory after an encoding process that introduces redundancy for the sake of error correction and data recovery during the decoding process. During encoding, raw information is received from a user (i.e., input data) and is encoded into codewords using an alphabet that can represent all the possible input values. In the case of a multilevel Flash cell memory, the cell levels are represented by a symbol, and multiple cells may be grouped together to form a symbol vector that corresponds to a codeword of the alphabet. For example, an eight-level Flash cell memory might group five cells together for processing. In such a case, each cell produces a symbol (for example, a symbol in the integer set $\{0, 1, 2, \ldots, 7\}$), such that five symbols together correspond to a codeword of the alphabet (for example, a codeword comprising a symbol vector equal to $\{35311\}$ where the vector is comprised of symbols). It is the five-symbol codeword that will be subjected to error correction processing. Thus, the coding alphabet in the example is comprised of the integer set $\{0, 1, 2, \ldots, 7\}$, which will be referred to as Q. In the example, codewords comprise five-tuples.

Multilevel Flash cell memories have smaller error margins than conventional two-level Flash cell memories. As a result, errors that have a low magnitude can be induced due to several physical effects such as charge loss during charge placement/removal processes, cross cell interference, device aging, and the like. Each of these low magnitude error sources induces a level shift in one dominant direction, thus comprising what is referred to herein as an asymmetric error information channel. In general, the asymmetric error is due in part to the property of the cell programming algorithm of iteratively approaching cell target levels from below, without overshoot. The conventional ECC schemes, however, do not account for such asymmetric errors and primarily utilize a binary code to handle tractable symmetric errors.

Thus, the relatively well-studied ECC techniques for use with symmetric channel errors have been unavailable or not useful for application to asymmetric error devices such as multilevel Flash cell memories. In addition, conventional ECC techniques do not take advantage of peculiarities of the limited magnitude, asymmetric error characteristics of devices such as multilevel Flash memories. Lastly, conventional ECC techniques can be relatively slow and inefficient for storing and retrieving data from devices such as multilevel Flash memories.

It should be apparent from the discussion above that there is a need for ECC schemes that can be applied to the limited magnitude asymmetric error information channel model and that can result in more efficient ways to achieve reliable storage as well as faster storage and retrieval. The present invention satisfies this need.

SUMMARY

In view of the above circumstances, the present invention provides a technique for tailoring the use of an ECC for correcting asymmetric errors with low magnitude in a data device, with minimal modifications to the conventional data device architecture. The technique permits error correction and data recovery to be performed with reduced-size error correcting code alphabets. For particular cases, the technique can reduce the problem of constructing codes for correcting limited magnitude asymmetric errors to the problem of constructing codes for symmetric errors over small alphabets. Also described are speed up techniques for reaching target data levels more quickly, by either early termination of the programming sequence, or by using more aggressive memory programming operations.

In one embodiment, an encoded data value comprising a codeword received over an information channel is processed, wherein the received codeword is a channel output y comprising symbols defined over an alphabet Q of size q, then symbol recovery is performed to obtain a word of symbols $\psi$ over an alphabet Q' of size q' wherein q>q' for an error correcting code $\Sigma$ defined over Q' and adapted to correct for up to t asymmetric l-limited magnitude errors. The symbols $\psi$ are then decoded with the error correcting code $\Sigma$ to obtain a decoded estimate $\hat{\chi}$ and an error-word estimate comprising a word of symbols $\hat{\in}$ over Q' such that $\Psi=\hat{\chi}+\hat{\in}$ mod q', and then the channel output y is combined with the error-word estimate $\hat{\in}$ and thereby produces the estimated codeword of the data value over the alphabet Q. The codeword estimate is discarded.

In another embodiment, run time programming of a data device is performed to reach a target level of a physical quantity in memory cells of the data device. This provides a "speed up" operation that reaches the target level more quickly than in conventional techniques. The speed up technique is useful with or without the reduced alphabet processing also described herein. In accordance with the speed up technique, an initial level of a physical quantity is established and the target level of the physical quantity is received, wherein the target level corresponds to a codeword of an error correcting code. A programming pulse sequence is provided, the pulse sequence comprising at least one pulse, wherein a first pulse increases the physical quantity from the initial level to a next level which is closer to the target level than the initial level, and subsequent pulses adjust the physical quantity toward the target level. The pulse sequence is terminated at a terminating level when pulse sequence parameters are satisfied. Thereafter, error correction occurs with adjusting the physical quantity from the terminating level to the target level for the codeword.

Other features and advantages of the present invention should be apparent from the following description of the preferred embodiments, which illustrates, by way of example, the principles of the invention.

BRIEF DESCRIPTION OF THE DRAWINGS

FIG. 1 is a sample illustration of the coding problem solved by a system constructed in accordance with the present invention.

DETAILED DESCRIPTION

I. Introduction

Figure 2:
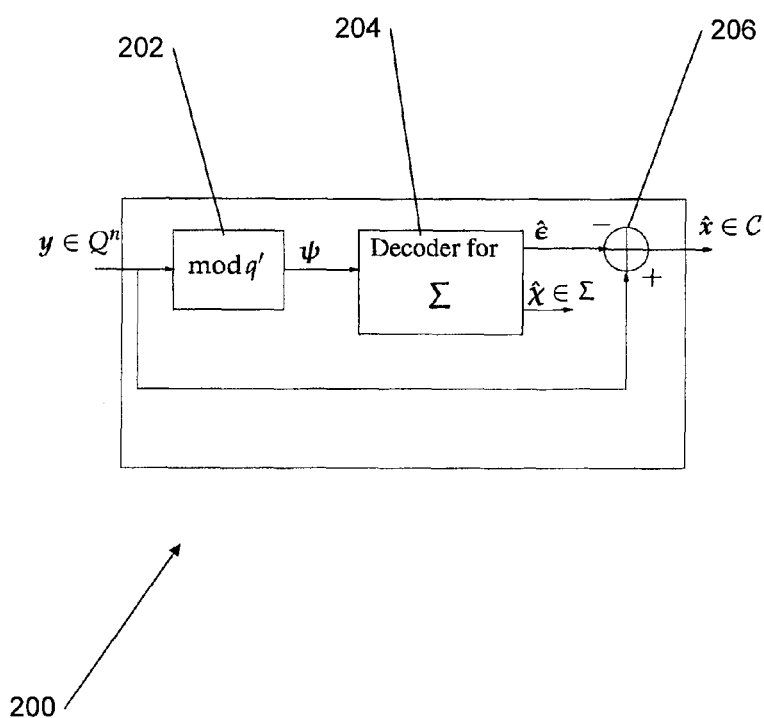
FIG. 2 is a schematic diagram of a decoder for use with an asymmetric l-limited-magnitude error-correcting code $\Sigma$ constructed in accordance with the present invention.

To scale the storage density of Flash memories, the multi-level Flash cell increases the number of stored bits in a memory cell such that each multilevel Flash cell stores one of q levels and can be regarded as a symbol over a discrete alphabet of size q. The most conspicuous property of Flash memory is the inherent asymmetry between cell programming (charge placement) and cell erasing (charge removal). This asymmetry can cause significant error sources to change cell levels in one dominant direction. Moreover, all reported common Flash error mechanisms induce errors whose magnitudes (the number of level changes) are small and independent of the alphabet size, which may be significantly larger than the typical error magnitude. These two error characteristics combined, strongly motivate the model of asymmetric limited-magnitude errors studied in this description. In addition to the (uncontrolled) errors that challenge Flash memory design and operation, codes for asymmetric limited-magnitude errors can be used to speed-up memory access by allowing less precise programming schemes that introduce errors in a controlled way.

Several physical effects that limit the reliability and performance of multilevel Flash memories induce errors that have low magnitude and are dominantly asymmetric. We describe block codes for asymmetric limited-magnitude errors over q-ary channels. In particular, code constructions are described for such channels when the number of errors is bounded by a certain parameter value. The construction uses known codes for symmetric errors over small alphabets to protect large-alphabet symbols from asymmetric limited-magnitude errors. The encoding and decoding of these codes are performed over the small alphabet, whose size depends only on the maximum error magnitude and is independent of the alphabet size of the outer code. The construction is extended to include systematic codes as well.

Following the presentation of the code construction, we demonstrate its power by showing that it provides code families that are perfect in the asymmetric limited-magnitude sense. Subsequently, some practical considerations of efficiently using the codes in memory devices are discussed. Another important practical issue is then resolved by a general extension of the construction to codes that are systematic, and thus offer implementation convenience. Finally, extensions and future research opportunities are discussed.

In another aspect, an improved cell programming algorithm is presented that provides a speed-up technique for more efficient data transfer in devices such as Flash memory.

A. Multilevel Flash Memory

Designing reliable Flash memories with higher storage volumes and lower costs per byte is challenging. At the current state of matters, the most efficient way to scale the storage density of Flash memories, is to use the Multi-Level Flash Cell concept to increase the number of stored bits in a cell. See, for example, B. Eitan and A. Roy, *Flash Memories*, P. Cappelletti, C. Gotta, P. Olivo, E. Zanoni Eds. Kluwer, pp. 91-152 (1999) and references therein. Contrary to ubiquitous single-bit Flash memories, where each cell is in one of two (Erased/Programmed) threshold states, multilevel Flash memories use a state space of $2^b$ threshold levels, to store b bits in a single cell. Since physical/engineering factors limit the overall window of threshold levels, a consequence of the multilevel Flash concept is both a requirement for fast, accurate charge placement mechanisms and compromised reliability margins (and a trade-off thereof). See, for example, B. Eitan et al., in *IEDM Technical Digest*, pp. 169-172 (1996). Charge placement/removal mechanisms, cross-cell program/read interference, and device aging, all introduce errors in stored data when the reliability margins shrink. These physical processes share the property that they typically move cells to adjacent threshold levels, commonly in one dominant direction. In the following, we elaborate on these phenomena in relation to limited-magnitude, asymmetric errors.

Being the paramount challenge of multilevel Flash memory implementation, faster and more accurate program schemes are a topic of significant research and design efforts. See, for example, M. Grossi et al., *Proceedings of the IEEE*, 91(4):594-601 (2003); A. Bandyopadhyay et al., *in proc. of the IEEE International Symposium on Circuits and Systems*, pp. 2148-2151 (2005); H. N. et al., *IEEE J. Solid-State Circuits*, 35(5):682-690 (2000). All these works share the attempt to iteratively program a cell to an exact prescribed level, in a minimal number of program cycles, with an acceptable added complexity to the programming hardware. The results of these attempts still require relatively many program cycles (on the order of ten or more cycles) and they work only up to a moderate number of bits per cell.

B. Cell Programming for Speed-Up

A key observation in the context of the present invention is that the progress made by individual program cycles is not uniform; as the cycle sequence approaches the target value, more "cautious" pulses are used to obtain an accurate programmed level. If program overshoots can be tolerated, then more "aggressive" program cycles can be employed to yield significantly faster memory write operations. An interpretation of that observation, is that loosening the accuracy requirement can offer significant savings in program time and consequently provide high program throughput. As described herein, the way to contain the (controlled) inaccuracies resulting from these overshoots is by devising error correcting codes with specific properties to combat errors that originate from the program process. The most appropriate model to capture these errors is by assuming channel errors that have limited magnitude and are asymmetric. The limited-magnitude assumption stems from the employment of programming schemes that can guarantee some level of accuracy. The asymmetry of the errors is due to the property that the errors are overshoots of the desired target value. Details on this issue are given in Section VIII below.

Besides the need for accurate programming, the move to multilevel Flash cells also aggravates reliability concerns in the design and operation of Flash memories. The same reliability aspects (that were successfully handled in Single Level Flash memories), may become more significant and translate to errors in stored data. Many of these potential errors also motivate the asymmetric limited-magnitude error channel. Low data retention, caused by a slow loss of charge from memory cells, is one such example. See, for example, P. Pavan et al., *Proceedings of the IEEE*, 85(8):1248-1271 (1997). Another potential error type relates to errors that originate from low memory endurance, by which a drift of threshold levels in aging devices may cause program and read errors, such as described in P. Cappelletti and A. Modelli, *Flash memories*, P. Cappelletti, C. Gotta, P. Olivo, E. Zanoni Eds. Kluwer, pp. 399-441 (1999). Program and read disturbs, caused by programming/reading proximate memory cells, also induce low magnitude errors with a dominant direction of change. These are described, for example, in P. Cappelletti and A. Modelli, *Flash Memories*, P. Cappelletti, C. Gotta, P. Olivo, E. Zanoni Eds. Kluwer, pp. 399-441 (1999).

C. Block Codes for Asymmetric Limited-Magnitude Errors

In view of the above circumstances, block codes for asymmetric limited-magnitude errors are provide according to the present invention wherein a reduced-size alphabet is utilized for error correction. The codes are parameterized by l, the maximum magnitude of an error, and t, the maximum number of asymmetric limited-magnitude errors to be corrected in a codeword of length n. Codes for correcting unidirectional errors of limited magnitude were discussed by R. Ahlswede, et al., in an article "On q-ary Codes Correcting All Unidirectional Errors of a Limited Magnitude" (2006) available over the Internet at Arxiv.org, http://arxiv.org/abs/cs/0607132, cited as "arXiv:cs/0607132v1[csIT]". The article at the Arvix.org Web site addresses the special case where the number of symbol errors in a codeword to be corrected is equal to the code-block size. That is, it addresses the special case of t=n, where the alphabet of the encoding is the same size as the alphabet of symbol recovery. Codes for error correcting of that special case can also be identified with the general construction method detailed below.

The example shown in FIG. 1 (comprising FIG. 1(a), FIG. 1(b), FIG. 1(c), and FIG. 1(d), collectively referred to as FIG. 1), illustrates the coding problem and introduces the main idea of the disclosed code construction. Suppose we have a group of five cells, each in one of eight possible threshold levels, marked by the integers $\{0, 1, \ldots, 7\}$.

The design goal is now chosen to be: protecting this group of five cells against t=2 errors of magnitude l=1 in the upward direction. As illustrated by the sample words in FIG. 1, if the stored levels are restricted to have either all symbols with even parity or all symbols with odd parity, the required protection is achieved. For each of the two sample codewords in FIG. 1(a), comprising the symbols (3, 5, 3, 1, 1) of the first codeword and the symbols (4, 6, 2, 2, 0) of the second codeword, the channel introduces two upward errors of magnitude one as shown in FIG. 1(b). The errors are shown to be (in boldface) as follows: for the first codeword, a "4" in the first symbol and a "2" in the fourth symbol, and for the second codeword, a "3" in the third symbol and a "1" in the fifth symbol. By majority, the locations of the errors are detected as shown in FIG. 1(c), in bold, the "4" and "2" in the first codeword, and the "3" and the "1" in the second codeword. The original codeword symbols are recovered by decrementing the erroneous symbols as shown in FIG. 1(d).

The example in FIG. 1 is one instantiation of a general construction method that provides codes for all possible code parameters. A valuable feature of a method according to the present invention is that for any target alphabet size (determined by the number of threshold levels), asymmetric limited-magnitude error correctability is inherited from symmetric error correctability of codes over alphabets of size l+1. In the case of the example in FIG. 1, it is the binary repetition code. Thus, a rich selection of known symmetric-error-correcting codes becomes handy to offer codes that are optimized for the asymmetric limited-magnitude channel. As a favorable by-product of the construction method, encoding and decoding of the resulting codes are performed on symbol sets whose sizes depend only on l, irrespective of the code alphabet (which may be much larger than l). This is a major advantage in both redundancy and complexity, compared to other proposed codes for multilevel Flash memories, whose encoding and decoding are performed over the large code alphabet. See, e.g., S. Gregori et al., *Proceedings of the IEEE*, 91(4):602-616 (2003).

II. t Asymmetric l-Limited-Magnitude Error-Correcting Codes

An alphabet Q of size q is defined as the set of integers modulo q: $\{0, 1, 2, \ldots, q-1\}$. For a codeword $x \in Q^n$ and a channel output $y \in Q^n$, the definition of asymmetric limited-magnitude errors now follows with Definition 1 (in this description, all definitions, theorems, propositions, and the like will be numbered sequentially, for identification).

Definition 1. Given a codeword $x=(x_1, x_2, \ldots, x_n) \in Q^n$ and a channel output $y=(y_1, y_2, \ldots, y_n) \in Q^n$. We say that t asymmetric l-limited-magnitude errors occurred if $|\{i: y_i \neq x_i\}|=t$, and for all i, $y_i \geq x_i$ and $y_i - x_i \leq l$. A generalization of the above definition is when we allow asymmetric errors to wrap around (from q−1 back to 0). We say that t asymmetric l-limited-magnitude errors with wrap-around occurred if $|\{i: y_i \neq x_i\}|=t$, and for all i, $y_i - x_i \pmod{q} \leq l$.

For notational convenience, given $x=(x_1, x_2, \ldots, x_n)$, the vector $(x_1 \bmod q', x_2 \bmod q', \ldots, x_n \bmod q')$ will be denoted by x mod q'.

The discussion of codes for this channel model is commenced with the definition of a distance that captures the correctability of t asymmetric l-limited-magnitude errors. For notational convenience, the phrase "asymmetric l-limited-magnitude errors" may be abbreviated as "A l M errors".

Definition 2. For $x=(x_1, \ldots, x_n) \in Q^n$ and $y=(y_1, \ldots, y_n) \in Q^n$, define $N(x, y)=|\{i: x_i > y_i\}|$, and $N(y, x)=|\{i: x_i < y_i\}|$. The distance $d_l$ between the words x, y is defined as $$d_l(x, y) = \begin{cases} n+1 & \text{if } \max_i (|x_i - y_i|) > l \\ \max(N(x, v), N(y, x)) & \text{otherwise} \end{cases}$$

The $d_l$ distance defined above allows to determine the number of A l M errors, correctable by a code C, as exemplified by Proposition 3.

Proposition 3. A code $C \subset Q^n$ can correct t A l M errors if and only if $d_l(x, y) \geq t+1$ for all distinct x, y in C.

To prove the correctability properties of the codes we soon propose, we do not resort to Proposition 3 above. Rather, a stronger way of proving correctability is used: providing decoding algorithms that use properties of known codes to guarantee successful decoding. We now provide the main construction below. To obtain a code over alphabet Q that corrects t or less asymmetric errors of l-limited-magnitude, one can use codes over smaller alphabets as follows. Let $\Sigma$ be a code over the alphabet Q' of size q'. The code C over the alphabet Q of size q (q>q'>l) is defined in Equation (1) below as $$C = \{x = (x_1, x_2, \ldots, x_n) \in Q^n : x \bmod q' \in \Sigma\}. \tag{1}$$

Error correction properties of C are derived from those of L in the following manner.

Theorem 4. C corrects t asymmetric l-limited-magnitude errors if $\Sigma$ corrects t asymmetric l-limited-magnitude errors with wrap-around. If $q \geq q'+l$, then the converse is true as well.

The last inequality (in Theorem 4) is a reasonable assumption, because the most useful codes are obtained when q>>q'. The code C is the reduced-alphabet error correcting code that can be employed in accordance with the invention.

Proof of Theorem 4: Let $x=(x_1, x_2, \ldots, x_n) \in C$ be a codeword and let $y=(y_1, y_2, \ldots, y_n) \in Q^n$ be the channel output when t asymmetric l-limited-magnitude errors have occurred. Denote the corresponding $\Sigma$ codeword by $\chi = x \bmod q'$, and also define $\psi = y \bmod q'$ and $\in = (\psi - \chi)(\bmod q')$. First we observe that since q'>l, if $0 \leq y_i - x_i \leq l$ then $y_i - x_i = (y_i - x_i) \bmod q'$. Using the simple modular identity $$(y_i - x_i) \bmod q' = (y_i \bmod q' - x_i \bmod q') \bmod q'$$
$$= (\psi_i - x_i) \bmod q'$$
$$= \varepsilon_i,$$

we get that $y_i - x_i = \in_i$, and in particular, if $0 \leq y_i - x_i \leq l$, then $0 \leq \in_i \leq l$. In other words, if the codeword x over Q suffered an asymmetric l-limited-magnitude error at location i, then the codeword X over Q' suffered an asymmetric l-limited-magnitude error with wrap-around at the same location i, and with the same magnitude. Given at most t asymmetric l-limited-magnitude errors with wrap-around, a decoder for $\Sigma$ can recover $\in$ from $\psi$. Thus, the equality $y_i - x_i = \in_i$ allows the same decoder to recover x from y. The only if part is settled by observing that, on the same grounds as above, a non-correctable error $\in$ for $\Sigma$ can be used to generate a non-correctable y vector for C.

Thus, in accordance with the invention, error processing for codewords defined over a code alphabet utilizes a reduced alphabet $\Sigma$ that is smaller than the code alphabet. That is, for a code alphabet L defined over a set Q, an error correcting code C that is constructed in accordance with the invention will comprise a smaller alphabet than Q, the alphabet used to encode the raw information.

A schematic diagram of a decoder constructed in accordance with the invention is shown in FIG. 2. The decoder 200 receives a y vector (codeword) from the information channel and outputs a recovered value x. The decoder 200 is used with an asymmetric l-limited-magnitude error-correcting code C that uses a decoder for a symmetric error-correcting code $\Sigma$ is given in FIG. 2. Depicted in FIG. 2 is a construction in which a channel output value y (e.g., data read from a Flash memory cell) is received in the decoder at a $\Sigma$ symbol recovery block 202 labeled as mod q' that produces a $\psi$ output value. The $\psi$ output is received at a $\Sigma$ decoder 204, which produces two output values, $\in$ and $\hat{\chi}$. The $\hat{\chi}$ value corresponds to an estimate of the input codeword and $\hat{\in}$ corresponds to an error estimate. The decoder output value, the estimated value $\hat{\chi}$, is discarded. The $\hat{\in}$ error value is subtracted from the original codeword (of the larger alphabet) at a block 206 and the result is produced as the estimated true codeword x, which is contained in the codeword set C. Thus, a decoder for Σ is run on the received symbol, modulo q', and the error estimate of the Σ decoder 204 is subtracted from the original received wordy. The operation of FIG. 2 is described further in the next paragraph.

Given a channel output y∈$Q^n$, the decoder takes the symbol-wise modulo q' of y to obtain ψ∈$Q^m$. Then a decoder for Σ is invoked with the input ψ and an error estimate $\hat{\in}$ is obtained such that $\hat{\chi}+\hat{\in}+\psi$ mod q', and $\hat{\chi}$ is a codeword of Σ within the correction radius of the decoder for Σ. Note that the codeword estimate $\hat{\chi}$ is discarded and not used for the decoding of C. Finally, $\hat{\in}$ is subtracted from the decoder input y to obtain the codeword estimate $\hat{x}$∈C.

Remark: If q'|q then C corrects t asymmetric l-limited-magnitude errors with wrap-around for Σ with the same properties as above.

The size of the code C is bounded from below and from above by the following theorem.

Theorem 5. The number of codewords in the code C is bounded by the following inequalities of Equation (2) below.

$$\left\lfloor \frac{q}{q'} \right\rfloor^n \cdot |\Sigma| \le |C| \le \left\lceil \frac{q}{q'} \right\rceil^n \cdot |\Sigma|. \tag{2}$$

Proof. If x is a codeword of C, then there always exists a (unique) pair of vectors z and X such that z mod q'=(0, 0, . . . , 0), x∈Σ, and x=z+x. The upper bound of Equation (2) is exactly the number of such pairs. Not all such pairs result in codewords. Indeed, when q'∤q, the vector z+X contains symbols in the set $$\left\{0, 1, 2, \ldots, \left\lceil \frac{q}{q'} \right\rceil q' - 1 \right\},$$

which is strictly larger than Q={0, 1, . . . , q−1}. On the other hand, if only z that do not contain the symbol $$\left( \left\lceil \frac{q}{q'} \right\rceil - 1 \right) q'$$

are considered, then summing any such z vector with any x∈Σ will give a codeword. That gives the lower bound.

In the special case when q'=2, the size of C can be obtained exactly.

Theorem 6. Let q'=2 and Σ be a code over Q'={0, 1}. Then the size of the code C, as defined in Equation (1), is given by $$|C| = \left\lceil \frac{q}{2} \right\rceil^n \cdot |\Sigma| - \sum_{w=0}^{n} A_w \left\lceil \frac{q}{2} \right\rceil^{n-w} \left( \left\lceil \frac{q}{2} \right\rceil^w - \left\lfloor \frac{q}{2} \right\rfloor^w \right)$$

where $A_w$ is the number of codewords of Σ with Hamming weight w.

Proof: When 2|q, the second term on the right equals zero as the matching lower and upper bounds of Equation (2) predict. This can be expected since all (z, X) pairs give distinct codewords of C. When 2∤q, we count the number of (z, X) pairs that when summed do not give a codeword, and subtract this number from the total pair count. It can be observed that if a codeword x∈Σ E has weight w, then all z words that have the symbol q−1 in at least one of the locations where X is non-zero, give z+X∉$Q^n$. All such z, X pairs are counted by the sum in the expression provided.

This theorem can be extended to q'>2, but in such cases knowing the weight distribution of Σ does not suffice, and more detailed enumeration of the code is needed for an exact count.

While Equation (1) provides a fairly general way of composing t asymmetric l-limited-magnitude error-correcting codes from similar codes over smaller alphabets, it is the following special case of this composition method, that proves most useful for obtaining strong and efficient codes.

Let Σ be a code over the alphabet Q', now of size l+1. The code C over the alphabet Q of size q (q≥l+1) is defined in Equation (3) below as $$C = \{x = (x_1, x_2, \ldots, x_n) \in \Sigma Q^n : x \mod (l+1) \in \Sigma\} \tag{3}$$

In this special case, C has the following property, given by Theorem 7.

Theorem 7. C corrects t asymmetric l-limited-magnitude errors if and only if Σ corrects t symmetric errors.

Proof: When q'=l+1, an asymmetric l-limited-magnitude error with wrap-around is equivalent to a symmetric error with no magnitude limit. This is, therefore, a special case of Theorem 4.

The l-AEC codes suggested in the Ahlswede article referenced above, at the Arxiv.org Web site, can be identified from this technique, and can be used to correct all asymmetric l-limited-magnitude errors. To show that such codes can correct asymmetric l-limited-magnitude errors, let O be the trivial length n code, over the alphabet Q' of size l+1, that contains only the all-zero codeword. Define $$C = \{x \in Q^n : x \mod (l+1) \in 0\}$$
$$= \{x \in Q^n : x_i \equiv 0 \mod (l+1) \text{ for } i = 1, 2, \ldots, n\}.$$

Since O can correct t=n symmetric errors, C can correct t=n asymmetric l-limited-magnitude errors.

III. Perfect Limited-Magnitude Error-Correcting Codes

To showcase the power of the code construction from Section II, we demonstrate how it can yield perfect codes in the asymmetric l-limited-magnitude error model. For that we first give a generalization of the q-ary symmetric "sphere packing" bound to the case of limited magnitudes. We then show that limited-magnitude error-correcting codes that meet this bound can be obtained by known perfect codes in the Hamming metric.

Theorem 8. If C is an l-limited-magnitude, t asymmetric error-correcting code with wrap-around, of length n over an alphabet of size q, then $$|C| \cdot \sum_{i=0}^{t} \binom{n}{i} l^i \le q^n. \tag{4}$$

Proof: The proof uses the same arguments as the proof for symmetric errors. Assume the number of (x, ∈) pairs exceeds $q^n$, where x is a codeword and $\in$ is an admissible channel error. Then there exists a vector $y \in Q^n$ such that $$y = x + \in = x' + \in',$$

where either $x \neq x'$ or $\in \neq \in'$ (or both). If $x \neq x'$ then we have a contradiction since given y the decoder will not be able to distinguish between x and x'. If $x = x'$, the additive property of the channel implies $\in \neq \in'$ as well, in contradiction to the assumption that $(x, \in) \neq (x', \in')$. Therefore the product of the code size and the number of admissible errors cannot exceed $q^n$ which gives the bound provided.

Perfect t asymmetric l-limited-magnitude error-correcting codes are obtained through the following proposition.

Proposition 9. If there exists a perfect (in the Hamming metric) code over an alphabet of size l+1, then there exists a perfect asymmetric l-limited-magnitude code with the same length, over an alphabet of any size q, such that l+1|q, that corrects the same number of errors.

Proof: We first substitute the expression for the code size from (2) into the left side of the sphere packing bound $$|C| \cdot \sum_{i=0}^{t} \binom{n}{i} l^i = \left(\frac{q}{l+1}\right)^n \cdot |\Sigma| \cdot \sum_{i=0}^{t} \binom{n}{i} l^i.$$

If the code $\Sigma$ over the alphabet of size l+1 is perfect, then its size satisfies $$|\Sigma| \cdot \sum_{i=0}^{t} \binom{n}{i} l^i = (l+1)^n.$$

Substituting the latter into the former we get $$|C| \cdot \sum_{i=0}^{t} \binom{n}{i} l^i = \left(\frac{q}{l+1}\right)^n \cdot (l+1)^n = q^n.$$

IV. Practical Considerations of Limited-Magnitude Error-Correcting Codes

A. Efficient Encoding and Decoding of Limited-Magnitude Error-Correcting Codes

The method of code construction proposed in Equation (1), specified the code C as a subset of $Q^n$. Moreover, the proof of Theorem 4 implicitly contained a decoding algorithm for the code, that uses a decoder for the smaller-alphabet code, to provide the correct codeword when admissible errors occur. Nevertheless, till this point, no encoding function from information symbols to codewords was provided. Discussing this encoding function is crucial when a practical coding scheme is required. When q'|q, a straightforward encoding function from information symbols over Q' to codewords of C over Q exists. We show this function using the following example.

Example 10

Let $\Sigma_H$ be the binary Hamming code of length $n=2^m-1$, for some integer m. (Non-binary Hamming codes can be used as well when l>1.) First we define the code $C_H$ in the way of Section II.

$$C_H = \{x = (x_1, x_2, \ldots, x_n) \in Q^n : x \bmod 2 \in \Sigma_H\}.$$

Figure 3:
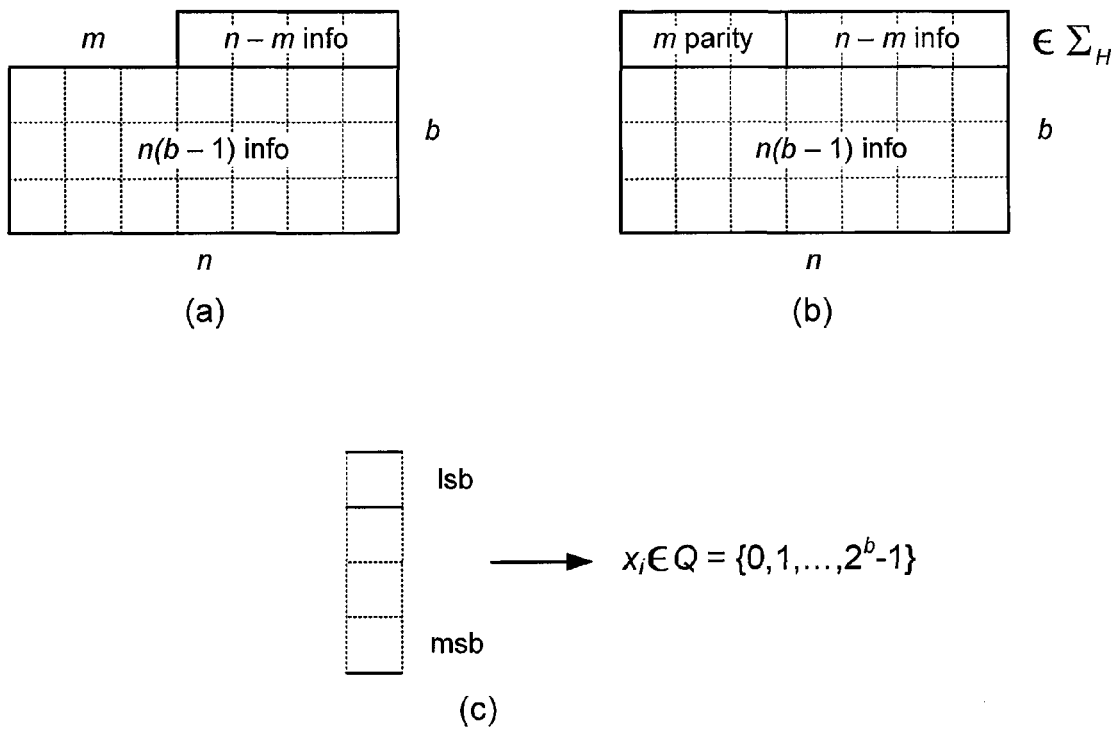
FIG. 3 is an illustration of an encoding process for use with a reduced alphabet code C constructed in accordance with the present invention.

By the properties of $\Sigma_H$, the code $C_H$ corrects a single asymmetric l=1 limited-magnitude error. When the code alphabet size is $q=2^b$, for some integer b, the perfect code $C_H$, whose size equals $|C_H| = 2^{(b-1)n} \cdot 2^{n-m} = 2^{nb-m}$ by Equation (2), admits a simple function from nb−m information bits to codewords of $C_H$ over Q. A possible encoding procedure for $C_H$ is illustrated in FIG. 3. In FIG. 3(a), nb−m information bits are input to the encoder. The encoder then uses a binary Hamming encoder to encode n−m of the information bits into a length n Hamming codeword (FIG. 3(b)). Finally, in FIG. 3(c), each q-ary symbol of the codeword $x \in C_H$ is constructed from b bits using the usual binary-to-integer conversion, the top row being the least-significant bits of $x_i \in Q$. Decoding is carried out by using a Hamming decoder to find the limited-magnitude error location and magnitude (for binary Hamming codes the magnitude is always 1). This value is then subtracted from the word y to obtain a decoded codeword. To recover the information bits after decoding, the Q symbols are converted back to bits in the usual way, and the m parity bits are discarded.

In the example, the alphabet size q satisfied $q=(q')^b$, which is stronger than q'|q. It is easy to see that the encoding method given above applies to the more general case with no added complexity, except that the information input to the encoder may need to be encoded into alphabets of different sizes.

B. Modulating Bits into Symbols over the Q Alphabet

By the master code construction in Equation (1), membership of a word of $Q^n$ in the code is determined by properties of its symbol-wise modulos. As a code over Q, Equation (1) gives a complete characterization of the code. However, when we discuss encoding information using codewords of this code, a more refined characterization of the code is in place. Specifically, one should specify how information bits (or more generally, digits), are to be encoded and modulated into Q symbols to generate the code. While different choices of encoding and modulation schemes may generate the same code, they may differ in their implementation complexity and in the bit error probability they provide. In Example 10, we mapped binary b-tuples into Q symbols by the usual positional conversion. For that mapping, we found a simple binary encoding function for the code, one that only constrains the least-significant bits to be a Hamming codeword. This mapping-encoding pair is only one way, admittedly the simplest one, to obtain an encoding function for the code over Q. Different such pairs can also be applied that offer benefits in a practical setting. We now discuss possible mappings between binary b-tuples and numbers in $\{0, 1, \ldots, q-1\}$, that have corresponding binary encoding functions for the code construction in Equation (1). We limit our discussion to q'=2 (hence l=1), though these mappings (or extensions thereof) can be used for larger q' as well.

(1) The positional mapping: A b-tuple $(a_0, \ldots, a_{b-1})$ is mapped to the symbol $$\sum_{j=0}^{b-1} a_j 2^j.$$

Then a word of $Q^n$ is a codeword if and only if its least-significant bits ($a_0$ of each symbol), form a codeword of the prescribed binary code. This mapping was used in Example 10.

(2) The Gray mapping: A b-tuple $(a_0, \ldots, a_{b-1})$ is mapped to the sequential number of the bit string $a_{b-1} \ldots a_0$ in a length b Gray code. For this mapping, encoding can be obtained by requiring that the bits $$\sum_{j=0}^{b-1} a_j \pmod 2$$

of each symbol, form a codeword of the prescribed binary code. That is true since the binary Gray code has the property that the sum modulo 2 of the tuple bits behaves like the least-significant bit in the usual positional mapping. Gray codes with this property exist for q'>2 as well. The Gray mapping will be most useful for the constructions of systematic codes in Section V.

(3) The hybrid mapping: Given a Gray code of length b−1, if the length b−1 bit string $a_{b-1} \ldots a_1$ has sequential number $\alpha$ in this Gray code, then the b-tuple is mapped to the number $2\alpha+a_0$. This mapping has the advantage that it can still be used in conjunction with the simple least-significant bit encoding, and in addition, it reduces the bit error probability when errors with magnitude greater than l occur.

C. Encoders

Figure 4:
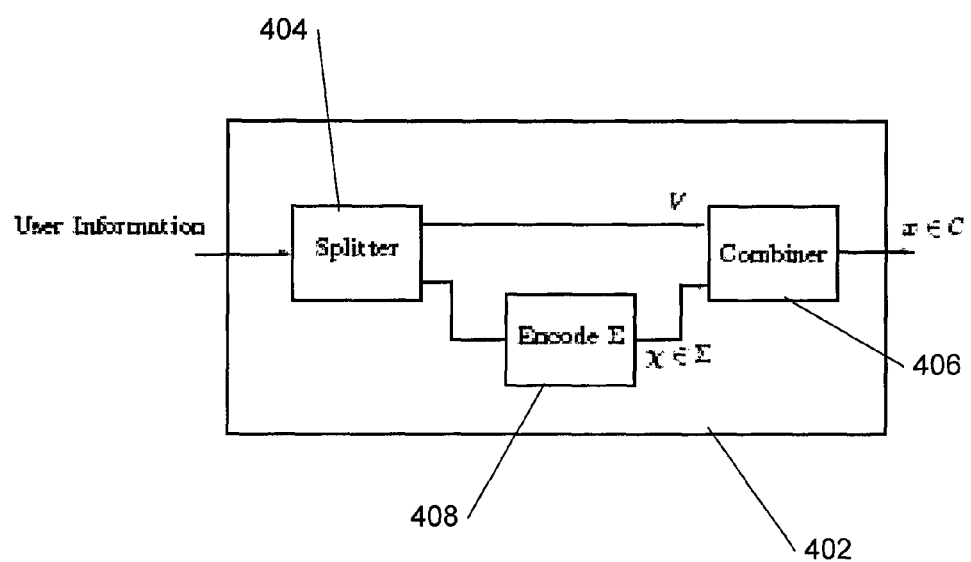
FIG. 4 is a schematic diagram of an encoder constructed in accordance with the present invention.

FIG. 4 is a schematic diagram of an encoder constructed in accordance with the present invention. User information in the form of data to be encoded and stored in a memory device is received into an encoder block 402. Inside the encoder, the user information is split into two parts by a splitter 404, which provides the user information to a combiner 406 and a Σ encoder 408. The Σ encoder encodes the user information, such as by adding parity symbols over the alphabet of size q'. The output of the Σ encoder comprises symbols χ, where χ∈Σ. The combiner 406 maps both parts (user information and Σ encoded output χ) into symbols over the alphabet of size q.

Figure 5:
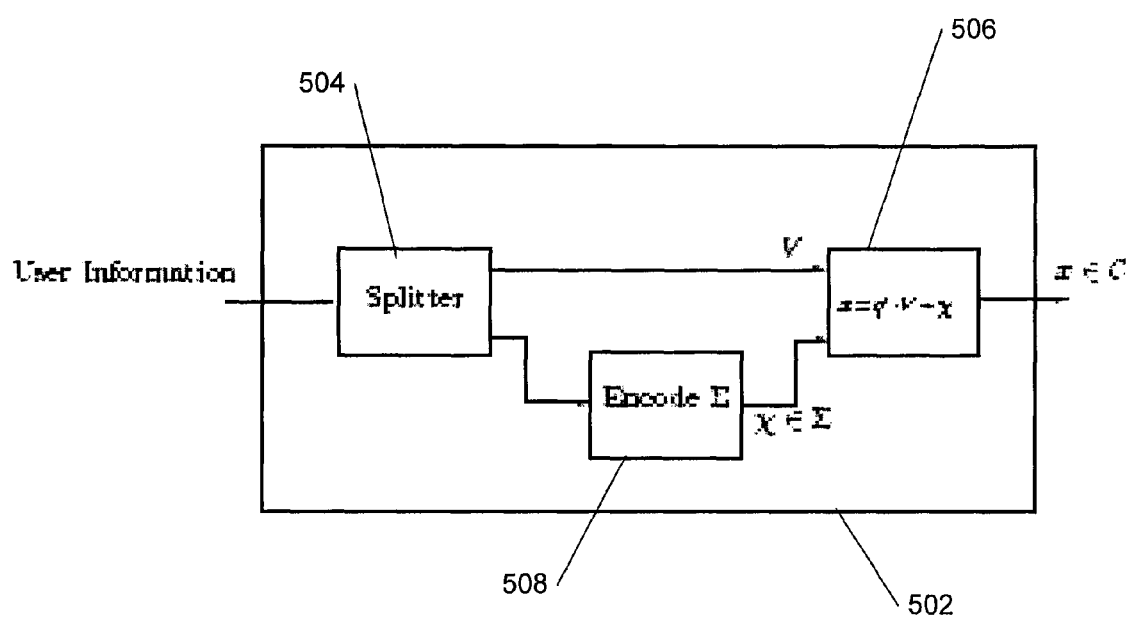
FIG. 5 is a schematic diagram of an encoder constructed in accordance with the present invention for a non-systematic error scheme.

FIG. 5 is a schematic diagram of an encoder constructed in accordance with the present invention for a non-systematic error scheme. The processing of the FIG. 5 encoder block 502 is similar to that of FIG. 4, so that a splitter 504 provides the user information to a combiner 506 and an encoder 508, except that the FIG. 5 combiner 506 uses the "pure" user information vector V as the high part of each symbol of x and uses the codeword χ as its lower part (i.e., its residue modulo q). In a similar way, each of the constructions for systematic codes and for simultaneous symmetric and asymmetric error correcting codes uses a different combining of V and χ into x. Such other constructions will be apparent to those skilled in the art, in view of the description herein.

V. Systematic Limited-Magnitude Error-Correcting Codes

The code construction discussed thus far was shown to have favorable properties. To this end we reduced the problem of constructing asymmetric l-limited-magnitude codes to the problem of constructing codes for symmetric errors over small alphabets. Codes with optimal redundancy were obtained, and simple encoding and decoding algorithms, over small alphabets, were proposed for these codes. All their advantages notwithstanding, these codes suffer the shortcoming of not admitting a systematic representation over Q. As seen in FIG. 3(b), (b−1)m of the information bits are encoded in the m symbols that also carry parity bits. Symbols that carry both information and parity bits are undesirable if the code is used in high speed memory applications, in which fast reading and writing are required. In such applications, data is often read off the memory without first decoding it, and therefore the process of reading is simplified if memory cells contain "pure" information. In such applications, error correction is done by a background decoding process, that uses the parity data to correct accumulated errors in information cells. This background process is termed memory scrubbing.

A trivial way to obtain systematic codes from the construction above is by not using these problematic (b−1)m information bits (e.g. setting them to constant zeros) and thus having all information stored in dedicated information symbols. However, this solution will result in a significant loss of storage efficiency, as the storage capacity of parity symbols is mostly wasted. In this section we seek more clever constructions for systematic asymmetric limited-magnitude error-correcting codes.

A. Systematic Codes for l=Limited-Magnitude Errors

When the error magnitude l is bounded by 1, the code Σ in the code construction in Equation (3) is a binary code. As we show next for this case, a modification of any code C can be carried out, that yields a systematic code with the same correction capability. We start off with an example.

Example 11

Figure 6:
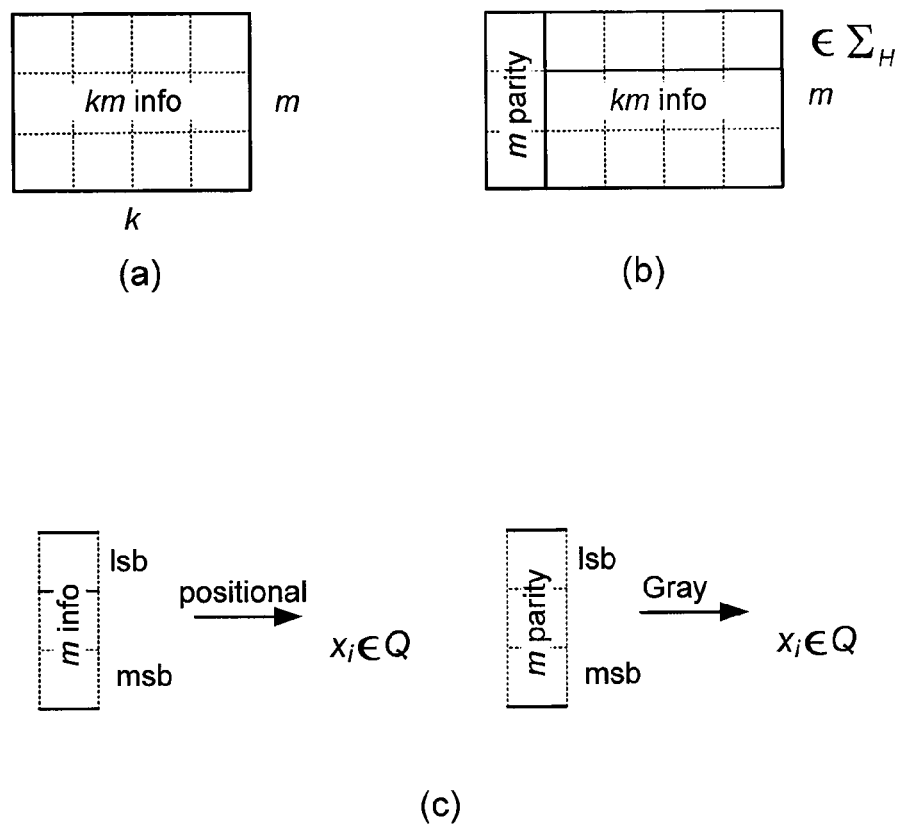
FIG. 6 is an illustration of an encoding procedure for a systematic code in accordance with the invention.

In this example we propose a systematic variant to the code $C_H$, given in Example 10. The encoding function given below generates a code that has the same correction capabilities as $C_H$, namely any single l=1 asymmetric error is correctable, though the resulting code is different. Specifically, the dimensions of the systematic code are different. For this example we assume that the alphabet size of the code is $2^m$ (m: the number of parity bits in the binary code), compared to $2^b$ for arbitrary b in $C_H$. This assumption can be lifted with a small increase in redundancy that depends on the actual code parameters. For an [n, k=n−m] binary Hamming code $\Sigma_H$, the length of the systematic code is n−m+1, compared to n in the non-systematic case. The encoding procedure for a systematic code is illustrated in FIG. 6 comprising FIGS. 6(a), 6(b), 6(c). In FIG. 6(a), km information bits are input to the encoder. The encoder then uses a binary Hamming encoder to encode the k information bits of the top row into a length n=k+m Hamming codeword (FIG. 6(b)). The parity bits of the Hamming codeword are now placed as a separate column. The mapping of bits to Q symbols, shown in FIG. 6(c), is the positional mapping for the k information symbols and the Gray mapping for the parity symbol.

To decode, a word of $Q^{k+1}$ is converted back to bits using the same mappings, and a binary Hamming decoder is invoked for the n coded bits. By construction, a single l=1 asymmetric error over Q, translates to a single bit error in the Hamming codeword: in the k information symbols, an l=1 error flips the least-significant bit that is encoded (and perhaps other bits in the column), and in the parity symbol, an l=1 error flips exactly one parity bit in the column, thanks to the Gray code used in the mapping.

The code proposed in Example 11, together with its encoding/decoding, can be generalized to any l=1 limited-magnitude t asymmetric error-correcting code as stated by the following proposition.

Proposition 12. Let Σ be a binary systematic code of length n and m≤b·r parity bits, for any two integers r and b>1. If Σ corrects t symmetric errors, then it can be used to construct a systematic t asymmetric t=1 limited-magnitude error-correcting code over an alphabet of size $q=2^b$. This code has length n−m+r, of which r symbols are parity symbols.

Proof: The general construction follows closely the one in Example 11. n−m information bits are used to encode a codeword of Σ. The m≤br parity bits are grouped into r columns of b bits each. Then these r columns are mapped to Q symbols using the Gray mapping and information bits are mapped to symbols using the positional mapping. The property that each limited-magnitude error results in one symmetric error in the codeword of Σ is preserved for this general case.

B. Systematic Codes for l>1 Limited-Magnitude Errors

If we try to extend the construction of the previous subsection to codes for l>1 limited-magnitude errors, we immediately face a stumbling block. Although generalized Gray codes exist for non-binary alphabets, their properties do not suffice to guarantee a similar general construction. The crucial property, that a single limited-magnitude error translates to a single symmetric error in the (l+1)-ary code, is lost for the general case. For example, if for l=2 a symbol represents the ternary reflected Gray codeword 0001, then an error of magnitude 2 will result in the Gray codeword 0012, whose Hamming distance to 0001 is 2 and not 1 as required. Thus, a limited-magnitude error at this symbol may induce 2 errors for the ternary code $\Sigma$. Evidently, this effect is not unique to the (l+1)-ary reflected Gray code, but is shared by all mappings between q-ary symbols $\{0, 1, \ldots, (l+1)^b - 1\}$ and (l+1)-ary b-tuples. We next consider ways to overcome this difficulty to reattain the generality of the systematic construction. The proposed solutions trade-off reduced redundancy with implementation simplicity.

(1) Making Parity Symbols Error-Free. Let Q be the alphabet with size $q=(l+1)^b$, for some integer b. Let $\Sigma$ be a (l+1)-ary systematic code with k information symbols and n parity symbols. $\Sigma$ corrects t symmetric errors and is used to construct a systematic asymmetric l-limited-magnitude error-correcting code C, in the way of Proposition 12. If the parity symbols of C are taken from a subset $\{x \in Q : x \equiv 0 \pmod{l+1}\}$, then any number of asymmetric l-limited-magnitude errors in the parity symbols can be corrected. This correction can be performed symbol-by-symbol, without using the code $\Sigma$. Next, similarly to the l=1 case, a decoder for $\Sigma$ is invoked to correct t or less asymmetric limited-magnitude errors in the information symbols. Furthermore, since the parity symbols of $\Sigma$ are now assumed to be error-free, the number of information symbols of C can be increased from k to k+m. By restricting the parity symbols to be from a subset of Q with relative size of $1/(l+1)$, the cost of this solution is one (l+1)-ary symbol per q-ary parity symbol.

(2) Ensuring a Single Symmetric Error with a Small Added Redundancy: When we examine more closely the properties of the (l+1)-ary reflected Gray code, we see that for any l and b, an asymmetric l-limited-magnitude error induces at most two symmetric errors in the (l+1)-ary code. Moreover, if an asymmetric l-limited-magnitude error induces two symmetric errors, then one of the two has to be in the right most location of the Gray codeword. While these properties themselves are not satisfactory for the construction, with a small amount of added redundancy (that becomes negligible with increasing l at most one symmetric error can be guaranteed. We first define the well known N-ary reflected Gray code and prove its aforementioned properties.

Definition 13. For an even N, let the N-ary reflected Gray code of length b be defined recursively, as follows.

$$G(1,N) = \begin{pmatrix} 0 \\ 1 \\ 2 \\ \vdots \\ N-1 \end{pmatrix}, G(b,N) = \begin{pmatrix} 0 & G(b-1,N) \\ 1 & G(b-1,N)^R \\ 2 & G(b-1,N) \\ \vdots & \vdots \\ N-1 & G(b-1,N)^R \end{pmatrix}$$

where the symbols in bold represent column vectors with $N^{b-1}$ identical elements. The sub-matrix $G(b-1,N)^R$ stands for $G(b-1,N)$ in reversed order.

Theorem 14. Let two words of G(b, N) be denoted $x_{j_1} = a_{b-1}a_{b-2} \ldots a_2a_1a_0$ and $x_{j_2} = c_{b-1}c_{b-2} \ldots c_2c_1c_0$, respectively. If $|j_2 - j_1| \leq N$, then $D(a_{b-1}a_{b-2} \ldots a_2a_1, c_{b-1}c_{b-2} \ldots c_2c_1) \leq 1$. D(x, y) is the Hamming distance between the two words. Moreover, $a_i$ and $c_i$ on the differing location i, differ by exactly 1 modulo N.

Proof: By construction, the $i^{th}$ symbol has ±1 transitions in G(b, N) list indices $j=sN^i$, where $s \equiv 1, 2, \ldots, N-1 \pmod N$. In particular, for i>0, N|j and therefore transitions are appropriately spaced in the upper n−1 indices.

The theorem proves that given an asymmetric l-limited-magnitude error, at most one of the upper b−1 (l+1)-ary symbols suffers an error with magnitude ±1 (i.e. $c_i \equiv a_i \pm 1 \pmod{l+1}$). Consequently, if we use only Gray codewords whose b−1 upper symbols have even parity, then an asymmetric (l+1)-limited-magnitude error induces only a single symmetric error (in the zero symbol) and thus the systematic construction for l=1 works for a general odd l. (The result extends to odd l+1, but the focus here is on more practical even sized alphabets.) This restriction on the contents of the parity symbols of C, amounts to roughly one bit of additional redundancy per q-ary parity symbol. For increasing l, this is a negligible loss in storage efficiency, compared to a full (l+1)-ary redundant symbol that was required in the solution in Section V-B.1) above. Ways to map (l+1)-ary parity symbols into the restricted alphabet of the q-ary parity symbols are omitted herein.

VI. Codes for Asymmetric and Symmetric Limited-Magnitude Errors

In Flash memory applications, a dominant error source may cause most of the errors to be in one known direction. However, other, more secondary error sources can inject errors that are more symmetrical in nature, but still have low magnitudes. To answer such plausible scenarios, we address a variation of the asymmetric l-limited-magnitude error model to include a (small) number of symmetric l-limited-magnitude errors.

Definition 15. A $(t_{52}, t\updownarrow)$ asymmetric/symmetric l-limited magnitude error is a vector e such that $|\{i: e_i \neq 0\}| \leq t_\uparrow + t\updownarrow$. In addition, $t\updownarrow$. of the indices of e satisfy $-l \leq e_i \leq l$, and the remaining $n - t\updownarrow$. indices satisfy $0 \leq e_i \leq l$.

In the following, we present a construction method for codes $C_\uparrow, \updownarrow$. that correct $(t_\uparrow, t\updownarrow.)$ asymmetric/symmetric l-limited-magnitude errors. This enhanced error correctability is achieved by modifying the construction in Equation (3) with the addition of an auxiliary binary code and a special mapping from information bits to q-ary symbols. We assume for simplicity that $q=2s(l+1)$, for some integer s.

Let $\sigma=(\sigma_1, \ldots, \sigma_n)$ be a codeword of a code $\Sigma$, over an alphabet of size l+1, that corrects $t=t_\uparrow + t\updownarrow. + t\updownarrow.$ symmetric errors. Let $V=(\vec{v}_1, \ldots, \vec{v}_n)$ be a two-dimensional binary array of size s×n, taken from an array code C that corrects a single bit error in each of at most $t\updownarrow.$ columns. Such codes can be obtained by length sn, binary $t\updownarrow.$ error-correcting codes, or more cleverly, using J. K. Wolfs Tensor-Product code construction method as described in "An Introduction to Tensor Product Codes and Applications to Digital Storage Systems", by J. K. Wolf in *Proceedings of* 2006 *IEEE Information*

Theory Workshop at 6 (2006). Each symbol of $x \in C_{\uparrow,\updownarrow}$ is composed from a symbol of the codeword $\Sigma$ and a bit vector of the codeword V as follows.

For any i, $$x_i = (l+1) \cdot \text{Gray}(\vec{v}_i) + \sigma_i \quad (4)$$

where Gray $(\vec{u})$ is the sequential number of the vector u in a binary Gray code on s bits. The code $C \: C_{\uparrow,\updownarrow}$ contains all $|\Sigma| \cdot |C|$ compositions of the codewords of $\Sigma$ and C.

Proposition 16. The code $C_{\uparrow,\updownarrow}$ is a $(t_\uparrow, t\updownarrow)$ asymmetric/symmetric l-limited-magnitude error-correcting code.

Proof Decoding of $C_{\uparrow,\updownarrow}$ is performed in two steps. Firstly, $C_{\uparrow,\updownarrow}$ is decoded as if it was a plain t asymmetric l-limited-magnitude error-correcting code. For the $t\updownarrow$ coordinates that possibly suffered errors in the downward direction, the first decoding step miscorrects these errors to exactly l+1 levels below their correct levels. Thus, for each of these $t\updownarrow$ miscorrections, the Gray mapping guarantees that the error resulting from this l+1 level discrepancy will be observed by the code C as a single bit error.

The counter-intuitive part of the construction in Equation (4) is that binary Gray mappings are used regardless of the error-magnitude l. This fact implies that the codes E and C cooperate with each other to achieve the prescribed correction capability, otherwise $\Sigma$ would need to operate over a larger alphabet for l>1.

VII. Implementation of Asymmetric Limited-Magnitude Error-Correcting Codes in Flash Devices While the majority of the results of this disclosure are formulated in mathematical terms, their great practical promise should not be overlooked. The gap between a good coding scheme from a theoretical perspective and an attractive coding scheme in practice is deep and often daunting—it was proved historically that improved error resilience, lower redundancy, and even efficient decoding do not suffice to attract technology providers to implement a coding scheme. In this section our intention is to project the coding results above on the design and operation of real Flash devices, thus showing their value for that particular application. To do that first show how asymmetric limited-magnitude error-correcting codes can be deployed with minimal excess hardware over current Flash architectures.

The codes proposed herein enjoy a key property that seems to allow a relatively painless access to them by commercial Flash products. The fact that the error-correcting engine of the new code constructions are codes for the symmetric channel, which are used anyway by common Flash devices to correct memory errors, permits a simple modification of the Flash architecture to obtain a much more targeted treatment of the observed errors.

Figure 7:
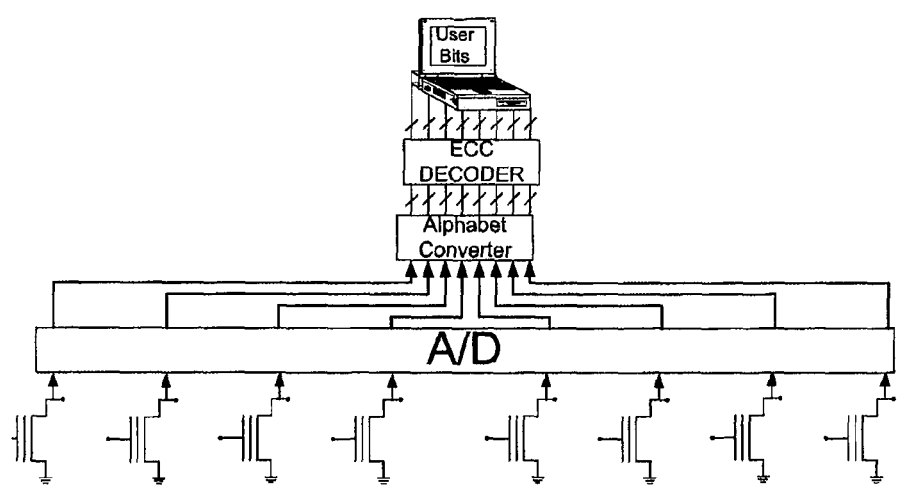
FIG. 7 is an illustration of a simplified Flash architecture with symmetric error-correcting codes in accordance with the invention.

In FIG. 7, a simplified Flash architecture with symmetric error-correcting codes is presented. The correction of errors is performed on the low-alphabet symbols, thus not utilizing the specific characteristics of multi-level Flash errors. The Flash cell contents are measured and converted to discrete levels using the A/D (Analog to Digital converter) block. Then, to match the chosen error-correcting code for symmetric errors, the discrete levels are represented in the appropriate alphabet (using the Alphabet Converter) and fed to the ECC (Error Correcting Code) decoder. The outputs of the decoder are then delivered to the device user. By converting the cell programmed levels to a lower alphabet, the structure of the Flash errors is lost and cannot be utilized by the ECC decoder.

Figure 8:
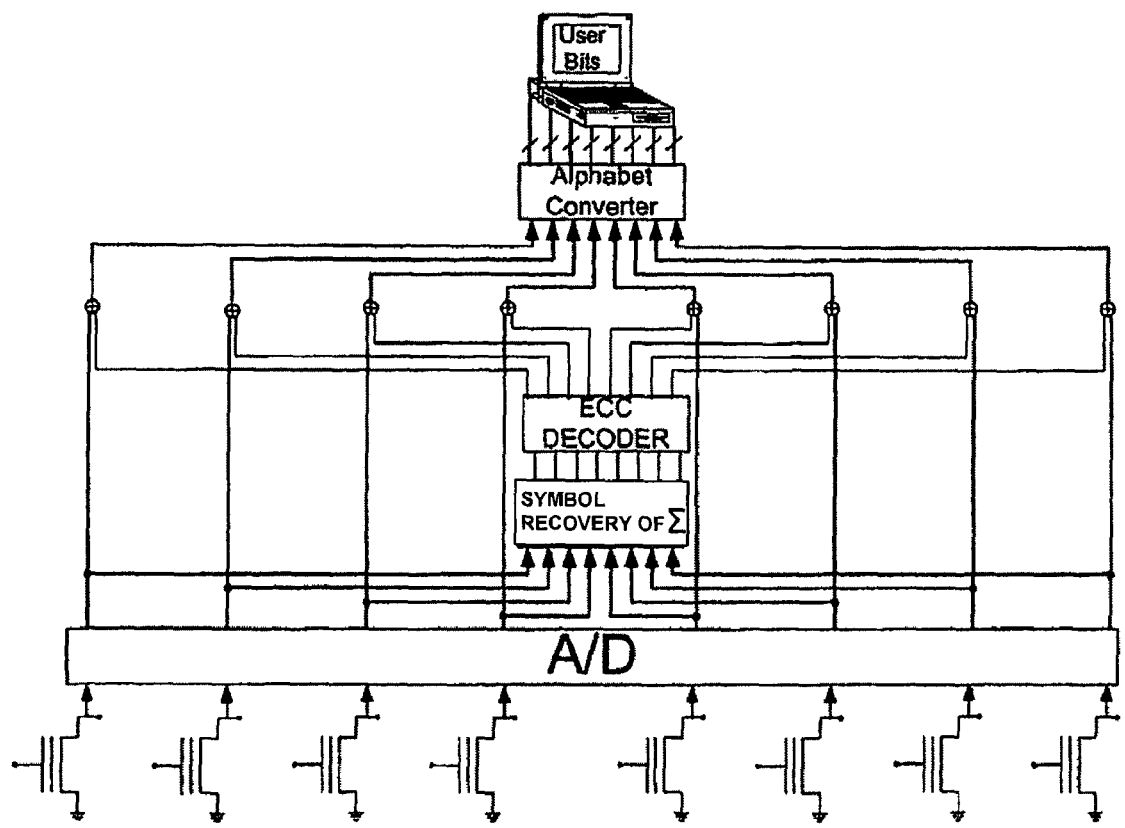
FIG. 8 is a diagram of a Flash architecture with an asymmetric l-limited-magnitude error-correcting code C that uses a decoder for an error-correcting code Y over a smaller alphabet in accordance with the invention.

In comparison, for the coding scheme proposed in this disclosure, a similar architecture provides guaranteed error control against common asymmetric limited-magnitude errors. On the basis of the schematic decoder diagram shown in FIG. 2, the physical implementation of a Flash architecture with an asymmetric l-limited-magnitude error-correcting code C that uses a decoder for a symmetric error-correcting code E; is presented in FIG. 8. The cell levels are similarly measured and converted to discrete levels. The modulo l+1 of these levels are fed to the same ECC decoder as in FIG. 7, whose error estimates are now subtracted from the discrete measured levels over the full alphabet (the subtraction is represented by the $\beta$ adder blocks). The corrected symbols are then passed to the user after a possible alphabet conversion. Thus, by installing circuitry to support the modulo operation and simple additions, the device designer is free to choose variable ECC Decoder blocks to obtain any error correction capability specified by t and l.

VIII. Programming Speed-Up

Figure 9:
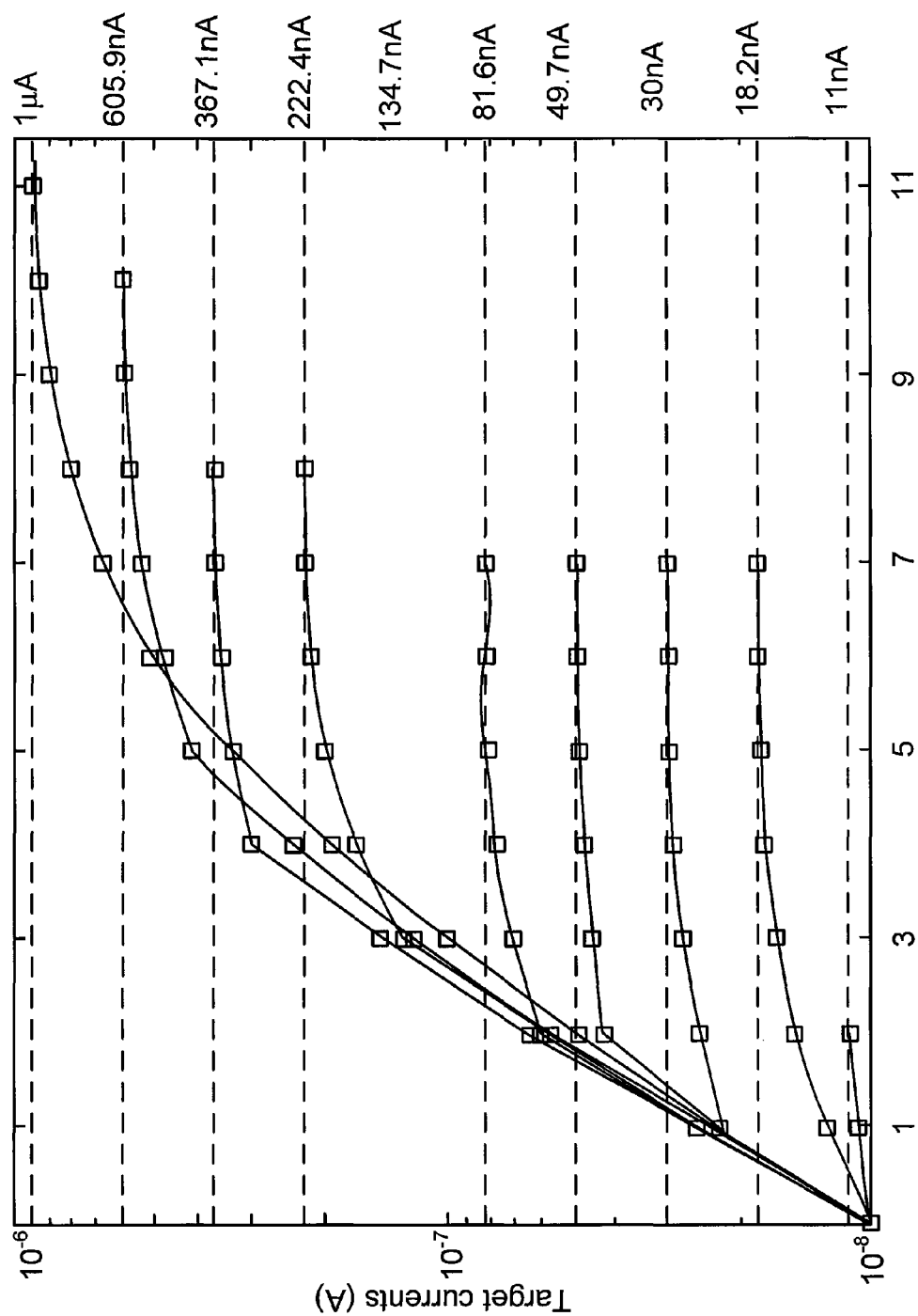
FIG. 9 is a graphical representation of a typical optimized Flash programming sequence such as used for Flash memory.

In this section, we analyze, as a function of l, the savings in programming time offered by asymmetric l-limited-magnitude error-correcting codes. As mentioned in section I, asymmetric limited-magnitude error-correcting codes can be used to speed up the cell programming process by allowing a faster, less precise programming pulse sequence. The behavior of a typical optimized Flash programming sequence is shown in the graph of FIG. 9, which is taken from A. Bandyopadhyay et al., in *Proc. of the IEEE International Symposium on Circuits and Systems*, pp. 2148-2151 (2005). The integers of the horizontal axis represent the program-pulse sequential numbers and the vertical axis represents electric current levels to which Flash cells are programmed. Although electric current level is referred to in this discussion, those skilled in the art will understand that the discussion applies equally to other physical quantities, such as electrical charge, voltage, and resistance.

In FIG. 9, the circles on each curve represent the results of an iterative programming algorithm for a given target value. In other words, a circle on a curve represents a current level achieved by a pulse at some point along the programming sequence. The different curves in FIG. 9 represent program sequences with different target current values. As can be clearly seen, most of the progress toward the target value is achieved by the early pulses, and the numerous later pulses are used for a fine asymptotic convergence to a value very close to the target. Therefore, having even a small error resiliency against asymmetric limited-magnitude errors can allow the programming sequence to terminate long before hitting the target value (due to the asymptotic nature of the programming curves) thus significantly speeding up memory access. Increasing the error resiliency beyond the flat part of the curve does not add significant benefits as at the steeper part of the curve where the vertical concentration of programming points becomes sparser.

To supplement the experimental evidence above, that tolerance to asymmetric limited-magnitude errors can speed-up the programming sequence, a quantitative analysis of the time savings is now carried out. The inputs to a Flash programming algorithm are the initial and target current levels; its output is a programming pulse of some width and amplitude, that attempts to move closer to the target level, under some constraints. To have an analytic description of the programming sequence, we need to model the programming algorithm in a way that captures its main design constraints in practice. In Flash devices, preventing over-programming, whereby the programming result exceeds the target level, is a crucial consideration taken by the programming algorithm. The reason for that being that Flash devices do not support single-cell erasures, and an over-programming instance requires erasing a full Flash block, an operation that is very costly in terms of time and device wear. The analysis to follow strongly builds on that property of Flash devices.

Thus, in accordance with the present invention, speed up of the memory programming process can be achieved by applying error correction to the resulting transfers over the information channel. As noted above, such error correction processing is not contemplated for most memories, and especially Flash memory devices and other devices characterized by asymmetric errors. The pulse sequence determination for speed up can take different forms. For example, the pulse sequence can be implemented to a predetermined number of pulses, so as to get sufficiently close to the target level of the physical quantity (such as current) such that error correcting techniques can be used to recover from any discrepancy to the codeword. The pulses are applied to move the physical quantity level from an initial level to a terminating level at the conclusion of the pulse sequence. Alternatively, the pulse sequence can be applied in a more aggressive fashion, even tolerating a terminating level for the physical quantity that is above the target level. Such overshoot is then corrected with the error correction operation. The overshoot condition might be reached, for example, by applying a predetermined number of pulses that are likely to result in overshoot. As noted, such overshoot can be compensated with error correction techniques, such as described above.

In either the predetermined sequence or the overshoot methodology, the error correcting techniques can employ the reduced alphabet processing described above. Other error correcting techniques can be used as well. The error correction can occur upon an access operation, such as receiving the data over the information channel for a write (programming) operation. Alternatively, the error correction can occur in a background process, wherein a memory device controller under the operation of a program, such as firmware or the like, can perform a background processing operation in which error correction processing is applied to memory cells of the memory device to obtain corrected values for memory cells and record the corrected values back into the respective cells, without waiting for an access operation to perform the correction.

Suppose a Flash cell is to be programmed from a lower level $I_i$ to a higher target level $I_F$. Since the change $\delta$ in the current level is a random variable whose distribution depends on the chosen programming pulse, we model it as an exponentially distributed random variable with mean $1/\mu$. $\mu$ will be determined by the programming algorithm as a function of $I_i$ and $I_F$, and subject to a constraint of fixing a low probability of over-programming. Specifically, u will be taken such that $$Pr(I_i+\delta > I_F) = \in.$$

$\in$ is a global parameter that specifies the allowable probability of over-programming. Substituting the exponential distribution of $\delta$, we get the integral equation specified by Equation (5):

$$\int_{I_F-I_i}^{\infty} \mu \exp(-\mu\delta)\,d\delta = \in. \tag{5}$$

Figure 10:
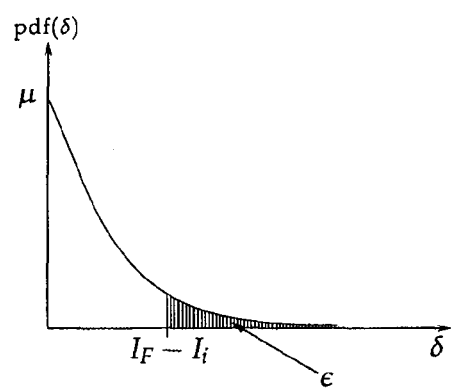
FIG. 10 illustrates the choice of a programming distribution based on the specified probability of over-programming.

FIG. 10 illustrates the choice of a programming distribution based on the specified probability of over-programming. For the starting level $I_i$ and target level $I_F$, the parameter $\mu$ of the exponential distribution is chosen such that the marked area under the probability density function graph equals $\Sigma$ (the specified probability of over-programming).

Solving Equation (5) and rearranging we get $$\mu = -\frac{\ln(\in)}{I_F - I_i}.$$

Hence we have the following relationship between the lower level $I_i$ and the final (higher) level $I_{i+1}$ specified by Equation (6):

$$I_{i+1} = I_i + \delta_i, \quad \delta_i, \delta_i\text{-Exponential}[-\ln(\in)/(I_F-I_i)]. \tag{6}$$

Note that the parameter of the exponential distribution of $\delta_i$ at each step i depends on the starting level $I_i$ that itself is a random variable.

Figure 11:
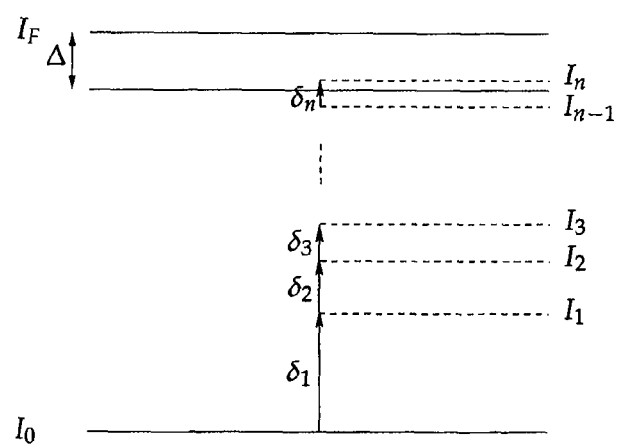
FIG. 11 is an illustration of the modeled programming sequence for writing values to a memory device.

Starting from an initial level $I_0$, the programming algorithm recursively updates the cell level according to Equation (6), and stops after the $n^{th}$ step if $I_n \geq I_F - \Delta$, where $\Delta$ is the maximum allowed downward deviation from the target level $I_F$. Discussed in detail later, the parameter $\Delta$ specifies the device tolerance to programming errors in the downward direction. A pictorial illustration of the modeled programming sequence is given in FIG. 11. On the left side of FIG. 11 are the initial level $I_0$, the target level $I_F$ and the tolerance parameter $\Delta$. In the middle is a sequence of exponentially distributed level increments $\delta_1, \delta_2, \ldots, \delta_n$ resulting from the programming algorithm. On the right side are the instantaneous levels $I_i$ until the process terminates at $I_n$.

To analyze the performance of the programming algorithm, we need to find the expected number of steps n, such that $$I_{n-1} < I_F - \Delta \leq I_n.$$

However, given the complex structure of the random process $I_i$, finding the mean of n is hard. (Note that $I_i$ is a Markov process with an uncountable number of states.) Instead, we will approximate $I_i$'s mean crossing time by the (deterministic) crossing time of the mean of $I_i$. This latter calculation is significantly easier since we can use the linearity of expectation to obtain a recursive formula for the mean of $I_i$. The accuracy of that approximation can be established using concentration bounds (e.g., Chebyshev inequality); however, for the discussion herein, a first order approximation should suffice.

Now taking the mean of Equation (6), we write $$\overline{I_{i+1}} = \overline{I_i} + E\left[\frac{1}{\mu_i}\right] = \overline{I_i} + K_e(I_F - \overline{I_i}), \tag{7}$$

where $K_\in \Delta -1/\ln(\in)$. Rewriting Equation (7) provides a recurrence relation on the expected programmed levels $$\overline{I_{i+1}} = \overline{I_i}(1-K_\in) + K_\in I_F.$$

Solving the recurrence for initial level $I_0$ we get the expression $$\overline{I_n} = I_0(1-K_\in)^n + I_F K_\in \sum_{i=1}^{n}(1-K_\in)^{i-1},$$

which after simplification becomes Equation (8):

$$\overline{I_n} = I_F - (1-K_\in)^n(I_F - I_0). \tag{8}$$

Now, by equating Equation (8) to $I_F - \Delta$ we can calculate the time N when the sequence of means $\overline{I_n}$, crosses $I_F - \Delta$:

$$I_F - (1-K_\in)^N(I_F - I_0) = I_F - \Delta$$

that gives Equation (9):

$$N = \frac{\log(I_F - I_0) - \log(\Delta)}{-\log(1 - K_\in)}. \quad (9)$$

The importance of Equation (9) is that it describes how the number of required pulses N depends on the error margin A. To compare the programming speed of Flash devices with and without an asymmetric limited-magnitude error-correcting code, we define two different error margins, $\Delta_c$ and $\Delta_{uc}$, respectively (the subscript c stands for coded and the subscript uc stands for uncoded, and obviously $\Delta_c > \Delta_{uc}$). The difference between the corresponding numbers of pulses $N_{uc}$ and $N_c$ is then $$N_{uc} - N_c = \frac{\log(\Delta_c/\Delta_{uc})}{-\log(1 - K_\in)}.$$

A conservative assumption is to $\Delta_c = (l+1)\Delta_{uc}$, where l is the parameter of the asymmetric-limited l-magnitude error-correcting code. This assumption corresponds to allowing the uncoded device a tolerance of one level (over the discrete alphabet Q), and the coded device a tolerance of l additional levels for the total of l+1 levels. Under that assumption, the saving in the number of programming pulses equals the relation given by Equation (10):

$$N_{uc} - N_c = \frac{\log(l+1)}{-\log(1 - K_\in)}. \quad (10)$$

For an over-programming probability $\in = 0.01$ the above equals $N_{uc} - N_c = 4.08 \log(l+1)$.

Approximate average savings in programming pulses for different values of l are given in Table 1 below.

TABLE 1

| l | $N_{uc} - N_c$ |
|---|---|
| 1 | 2.84 |
| 2 | 4.48 |
| 3 | 5.66 |
| 4 | 6.57 |
| 5 | 7.31 |
| 6 | 7.94 |

The percentage of savings $(N_{uc}-N_c)/N_{uc} \times 100$ depends on the particular difference $I_F - I_0$, but it generally grows as the program window $I_F - I_0$ gets smaller. As seen in Table 1, and as can be expected from the logarithmic function of l, increasing l beyond some point exhibits diminishing returns and does not significantly contribute to increased savings in programming time. Note that this last qualitative observation is one we have already made when discussing FIG. 9 earlier. Thus, both the experimental and analytical results show that a small tolerance of asymmetric limited-magnitude errors translate to large savings in Flash programming time. Note, however, that while our model successfully predicts the asymptotic behavior of the programming algorithm [through the $(1-K_\in)^n$ sequence in Equation (8)], it stops short of accounting for some of the properties of the curves in FIG. 9. For example, the expression for $N_{uc}-N_c$ in Equation (10) suggests that the numbers of saved pulses are independent of the initial and target levels. Whereas comparing the uppermost and middle curves of FIG. 9 clearly concludes that this is not the case in practice so that there are other constraints on the programming algorithm not included in our model.

The new codes described above are tailored to an error model motivated by Flash memory design and operation. Reduced amounts of redundancy and simpler decoding algorithms are achieved thanks to the finer characterization of the underlying errors. A powerful property of the codes herein is that the coding parameters n, t, l need not be fixed for a Flash memory device family. After implementing the simple circuitry to support this coding method, different code parameters can be chosen, depending on the application, and implemented off-chip. Other features can be provided in view of the description herein. For example, similar ideas can lead to codes that correct symmetric limited-magnitude errors, or more generally, asymmetric double-sided limited-magnitude errors that may arise in particular designs. Also, when the reading resolution is larger than the code alphabet size (e.g. readers that give a real number rather than an integer), improved decoding techniques can be readily applied using "limited-magnitude erasures" or other soft interpretations of the read symbols. Better systematic codes may be obtained by observing the relation between the limited magnitude errors and the errors they impose on the low-alphabet code, and then replacing the symmetric error correction properties we required with various Unequal Error Protection properties. On the flip side, a careful analysis of miscorrections (and the bit error probability they induce) by those codes and mappings should be carried out. Finally, the performance of the codes and the accuracy of the channel model should be validated in an actual Flash storage design.

Figure 12:
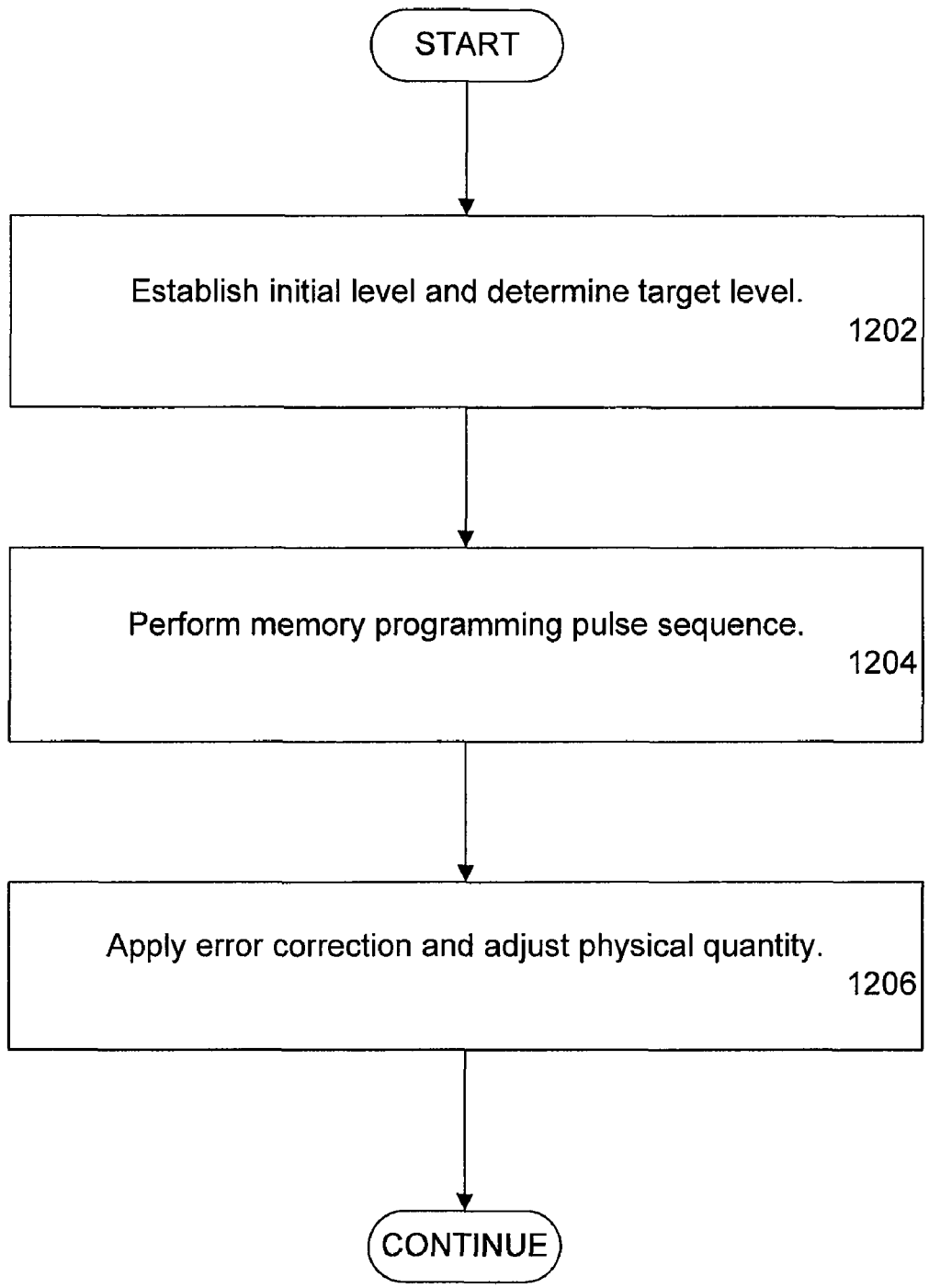
FIG. 12 is a flow diagram of operations for speed up processing in accordance with the present invention.

Thus, the speed up processing described above provides a more efficient means of reaching a target level in memory devices such as Flash memory, for programming memory cells with a desired target level of a physical quantity that represents a data value. FIG. 12 is a flow diagram that illustrates the speed up processing.

In the first operation of FIG. 12, represented by the flow diagram box numbered 1202, an initial level is established or determined, and the target level of the physical quantity is received. The initial level may correspond to an erased state of the memory cell or a preexisting level. The target level corresponds to a codeword of an error correcting code. At box 1204, a programming pulse sequence is performed, comprising at least one pulse, wherein a first pulse increases the physical quantity from the initial level to a next level which is closer to the target level than the initial level, and subsequent pulses asymptotically adjust the physical quantity toward the target level to a terminating level. In conventional systems, the terminating level is the level that is at the desired level of accuracy for the memory device; reaching the terminating level suffices as the target level and memory programming is concluded. In the speed up processing of FIG. 12, and as described above, the next operation (box 1206) is to apply error correction and adjust the physical quantity from the terminating level to the target level for the codeword. Thus, the programmed memory value is set to the target level.

The error correction and physical quantity adjustment of box 1206 may be performed with a variety of techniques according to design requirements. For example, the error correction of box 1206 may be performed upon reading the value from the memory cell. Alternatively, the error correction processing of box 1206 may be performed in a background process, such that memory cell values are corrected and adjusted in a background process independently of any retrieval operation. Such background processing is commonly referred to as processing with a scrubber.

For the box 1206 operation, in the case of correction-upon-read, a single instance of error correction may be applied, incorporated into the memory controller error correction processing. Such error correction processing may be performed in conjunction with the reduced alphabet code construction described above. Alternatively, other error correcting techniques may be used to correct for the additional errors possibly introduced by the speed up processing. For the single instance of error correction technique, a "stronger" error correction code may be required than would otherwise be used without speed up. Those skilled in the art will understand how to select an error correcting code that is sufficient for the additional error, in view of the description herein. Similarly, selection of a reduced alphabet error correcting code as the single instance of error correction will be known to those skilled in the art, in view of the description herein.

In the speed up processing of FIG. 12, the box 1204 operation of performing a memory programming pulse sequence may be performed with a variety of techniques. For example, the programming pulses may be applied with a reduced set of pulses as compared with conventional practice. That is, conventional memory programming typically relies upon slowly approaching the target level to within a desired accuracy limit. Thus, conventional practice calls for a relatively extended pulse sequence to ensure the target level is approached asymptotically to within the desired accuracy, without overshoot. In contrast, with the disclosed speed up process with a reduced set of pulses, the stopping criterion is a relaxed accuracy as compared with the accuracy for typical programming pulse sequences. That is, the pulse sequence in accordance with the present invention will typically reach the relaxed accuracy tolerance more quickly than conventional techniques and will terminate the pulse sequence in fewer pulses. For example, the pulse sequence may not approach the terminating level in an asymptotic fashion. The pulse sequence may use pulse steps that are greater in size than conventional. Each incremental pulse may be equal in size, to more quickly satisfy the relaxed accuracy and reach the terminating level. In this way, the pulse sequence is terminated with a reduced number of pulses, introducing an error (i.e., the terminating level is not within the typical desired accuracy). In accordance with the speed up processing, the difference between the terminating level and the target level is adjusted through error correction (as indicated in box 1206). If desired, the number of pulses to apply in reaching the terminating level may be determined as described above (see Equation (9) and accompanying discussion) and the pulse sequence may be stopped after the predetermined number of pulses are executed.

Figure 13:
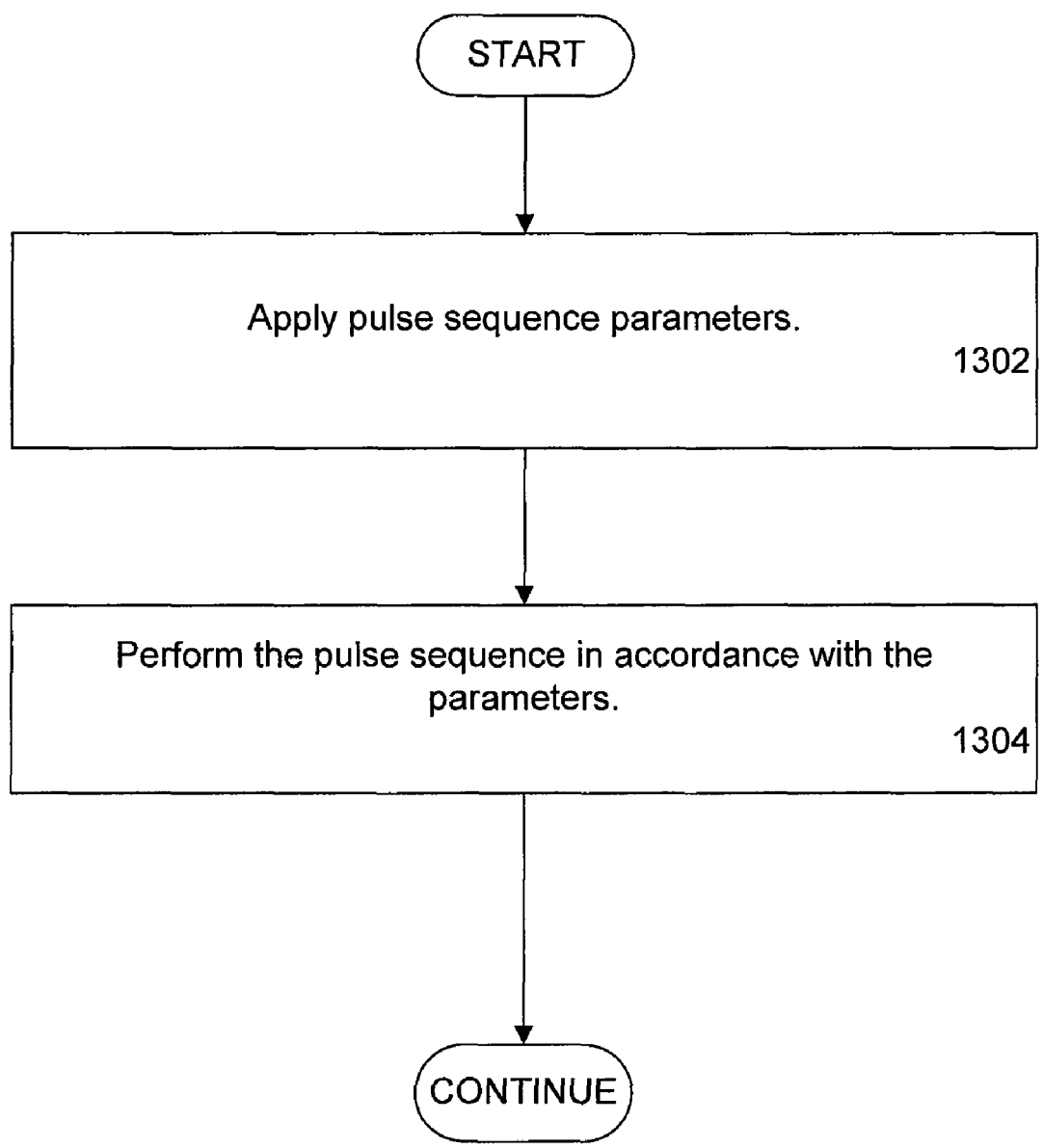
FIG. 13 is a flow diagram of operations for a pulse sequence for the speed up processing of FIG. 12.

FIG. 13 is a flow diagram that illustrates the reduced pulse sequence operation for performing the sequence of programming pulses corresponding to the operation of box 1204 in FIG. 12. In the first operation of FIG. 13, at box 1302, the pulse sequence parameters are applied. As noted, the accuracy tolerance may be relaxed from typical values, or a predetermined number of pulses may be determined, so as to reduce the number of pulses as compared with conventional processing. At box 1304, the sequence is performed according to the pulse sequence parameters until the terminating level is reached.

As an alternative to the speed up with a reduced set of pulses and relaxed accuracy, the pulse sequence of box 1204 may be performed so as to tolerate overshoot. As noted above, overshoot is typically not tolerated in programming memory, especially in the case of Flash memory devices. In accordance with the speed up processing described herein, overshoot may be intentionally invoked, to be compensated for by the subsequent error correction of box 1206. Thus, a more aggressive pulse sequence implementation may be utilized, to reach (and perhaps surpass) the target level in a reduced amount of time (with a reduced number of pulses and/or larger pulse step sizes). Thus, each pulse may have a greater magnitude than typical, or the number of pulses may be greater than typical, because in this aspect overshoot to the terminating level is tolerated. A choice between such options as between pulse sizes and number of pulses up to overshoot will be implemented in the programming of the memory device in accordance with memory device design, as will be known to those skilled in the art in view of this description.

Figure 14:
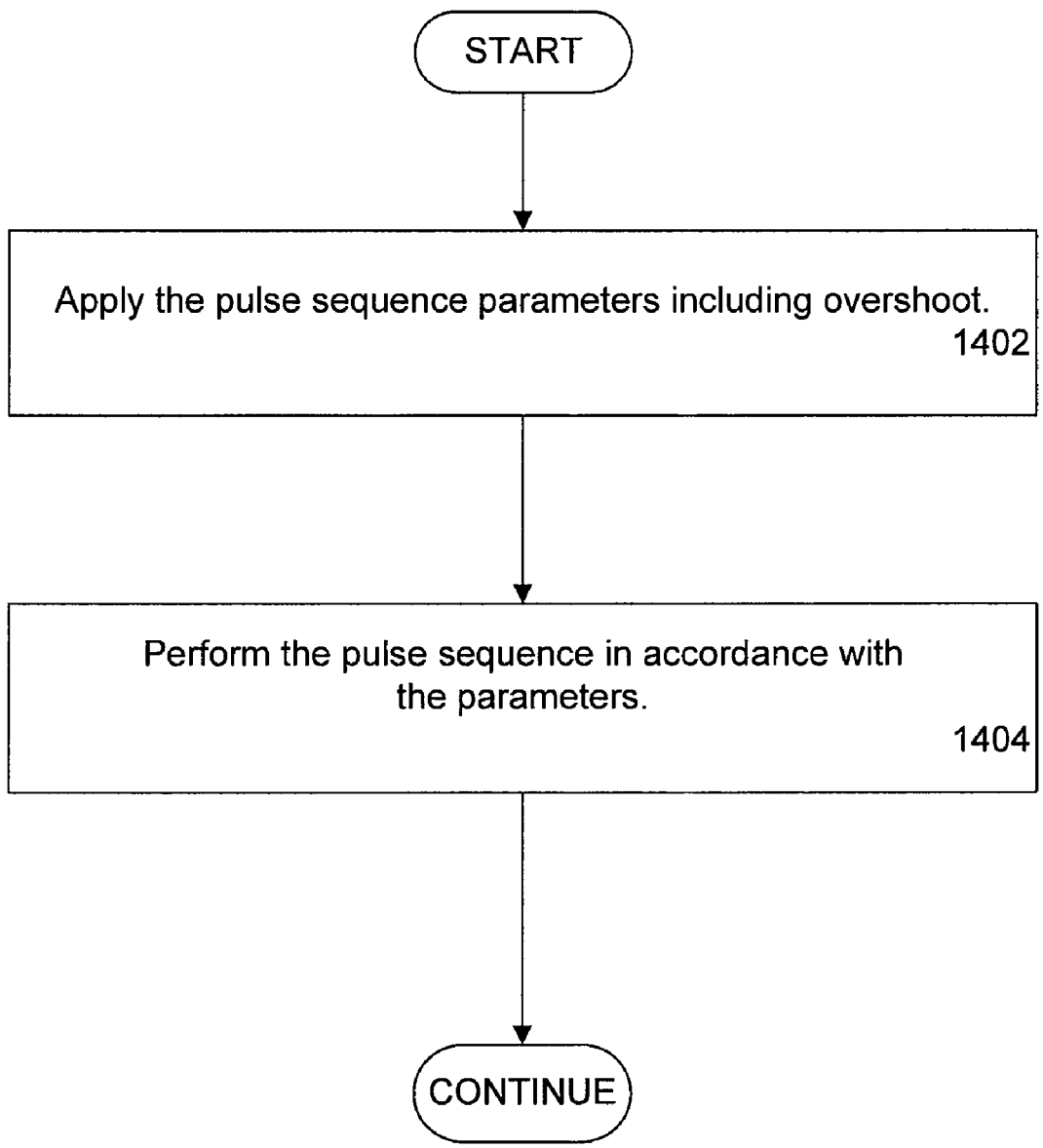
FIG. 14 is a flow diagram of operations for speed up processing of FIG. 12 with overshoot.

FIG. 14 is a flow diagram that illustrates the overshoot pulse sequence operation for performing the programming pulse sequence corresponding to the operation of box 1204 in FIG. 12. In the first operation of FIG. 14, at box 1402, the parameters for the pulse sequence to be performed are applied. As noted above, the pulse sequence parameters may call for increased magnitude pulses, or additional pulses, or other techniques, subject to a tolerance for inducing an overshoot condition and surpassing the target level. At box 1404, the pulse sequence is terminated according to the application of box 1402, with the result that the memory cell may be in a known overshoot condition. Processing then returns to FIG. 12 for error correction (box 1206).

IX. Device Implementation

Figure 15:
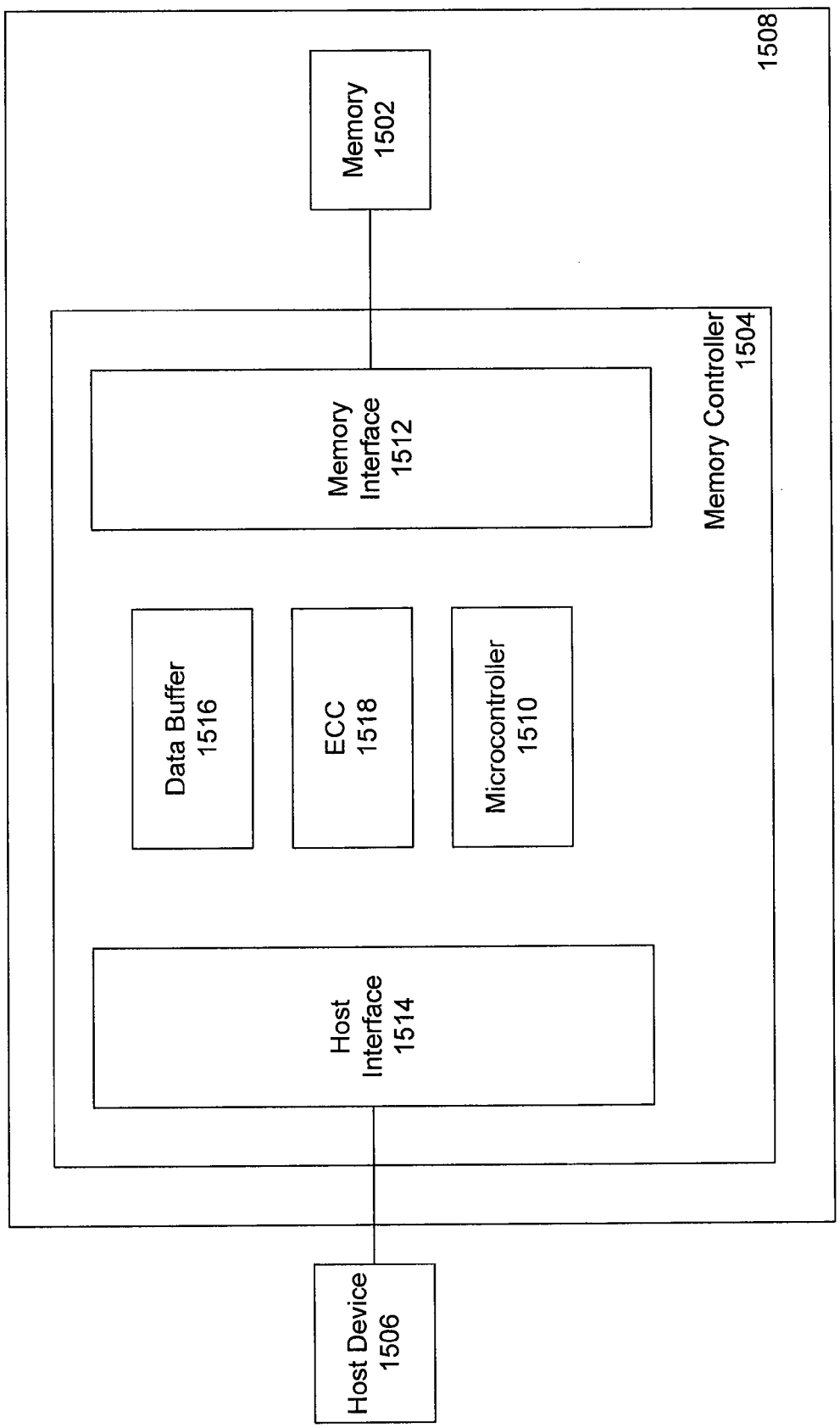
FIG. 15 is a block diagram of a memory device constructed in accordance with the present invention.

FIG. 15 is an illustration of a memory device constructed in accordance with the present invention. FIG. 15 shows a memory 1502 that is accessed by a memory controller 1504 that communicates with a host device 1506. The memory 1502 is used for storing data and is characterized by asymmetric errors over the information channel. The memory may be implemented, for example, as a Flash memory having multilevel cells. The memory 1502 and memory controller 1504 together comprise a memory device 1508 that may be external to the host device or may be integrated with the host device into a single component or system. For example, the memory device 1508 may comprise a Flash memory device that communicates with a host computer via a USB connection. Alternatively, the memory device may be integrated with a suitable host device to comprise a single system or component, such as a smart phone or network router or MP3 player or the like.

The memory controller 1504 operates under control of a microcontroller 1510, which manages communications with the memory 1502 via a memory interface 1515 and manages communications with the host device via a host interface 1514. Thus, the memory controller supervises data transfers from the host 1506 to the memory 1502 and from the memory 1502 to the host 1506. The memory controller 1504 also includes a data buffer 1516 in which data values may be temporarily stored for transmission over the data channel between the memory 1502 and the host 1506. The memory controller also includes an ECC block 1518 in which the ECC is maintained for operation in accordance with the techniques described herein. As described herein, the ECC block contains ECC data typically used in applications for a symmetric error information channel. The code in the ECC block 1518 is selected in accordance with the techniques described herein.

X. Producing and Selecting an Error Correction Code

Designing a data device, such as a Flash memory, can be achieved in conjunction with the techniques described herein. As noted previously, the selection of codes is specified by the parameters t and l, where t specifies the number of errors to be corrected and l specifies the maximum magnitude error to be corrected (and the maximum magnitude expected over the information channel). As noted with Theorem 4 above, an error correcting code $\Sigma$ defined over Q and adapted to correct for up to t asymmetric l-limited magnitude errors can be specified for a received channel output symbol y such that $\psi$ mod q' is the sum of $\hat{\chi}+\hat{\in}$ where $\hat{\chi}$ is a codeword estimate that is an element of $\Sigma$ and $\psi$ mod $q'=\hat{\chi}+\hat{\in}$, where the estimated codeword is achieved by taking the channel output y with the difference of the error estimate $\hat{\in}$. In the case where q>q' an error correcting code C is defined by $$C=\{x=(x_1, x_2, \ldots, x_n)\in Q^n: x \bmod q' \in \Sigma\}.$$

As described above, the alphabet of C is larger than that of $\Sigma$. As described further below, C may be determined with the aid of suitable computer applications software.

In the special case where q'=l+1 and $\Sigma$ is adapted to correct symmetric errors, an error correcting code C is defined by $$C=\{x=(x_1, x_2, \ldots, x_1)\in Q^n: x \bmod(l+1)\in\Sigma\}.$$

In such a case, the error correcting code C will be defined over a larger alphabet than $\Sigma$ as per above, with the added benefit that $\Sigma$, an error correcting code for symmetric errors, can be utilized by C for correcting t asymmetric limited magnitude errors. Those skilled in the art will appreciate that error correcting codes for symmetric errors are readily available and thoroughly studied. As before, C may be determined with the aid of suitable computer applications software.

Computer applications software to select error correcting codes $\Sigma$ and C can be executed on any conventional personal computer, server, or the like available today. For example, any computer system capable of supporting an operating environment such as "Windows Vista" by Microsoft, Inc. or "Mac OS X" by Apple, Inc., and various UNIX and Linux systems, will have sufficient computing resources to perform the functions described herein. Such computer systems should have sufficient storage resources to maintain a database of error correcting codes for selection, or should have network access to a computer system that can provide such error correcting codes for selection. A suitable code design software application receives as input the parameters necessary to specify the error correcting code, in particular, the desired t and l parameters. Those skilled in the art will understand how to provide a suitable user interface to receive such parameters. The code design application also determines code parameters, either by programmed operations or additional user input, to specify an error correcting code in accordance with the description provided herein. For example, parameters and selection according to Theorem 4 and Theorem 7 above should be accommodated by the code design application. Once the design parameters are determined, the application will access a database of codes to present alternative codes to the user. The code design application provides both the error correcting codes, L and C.

Figure 16:
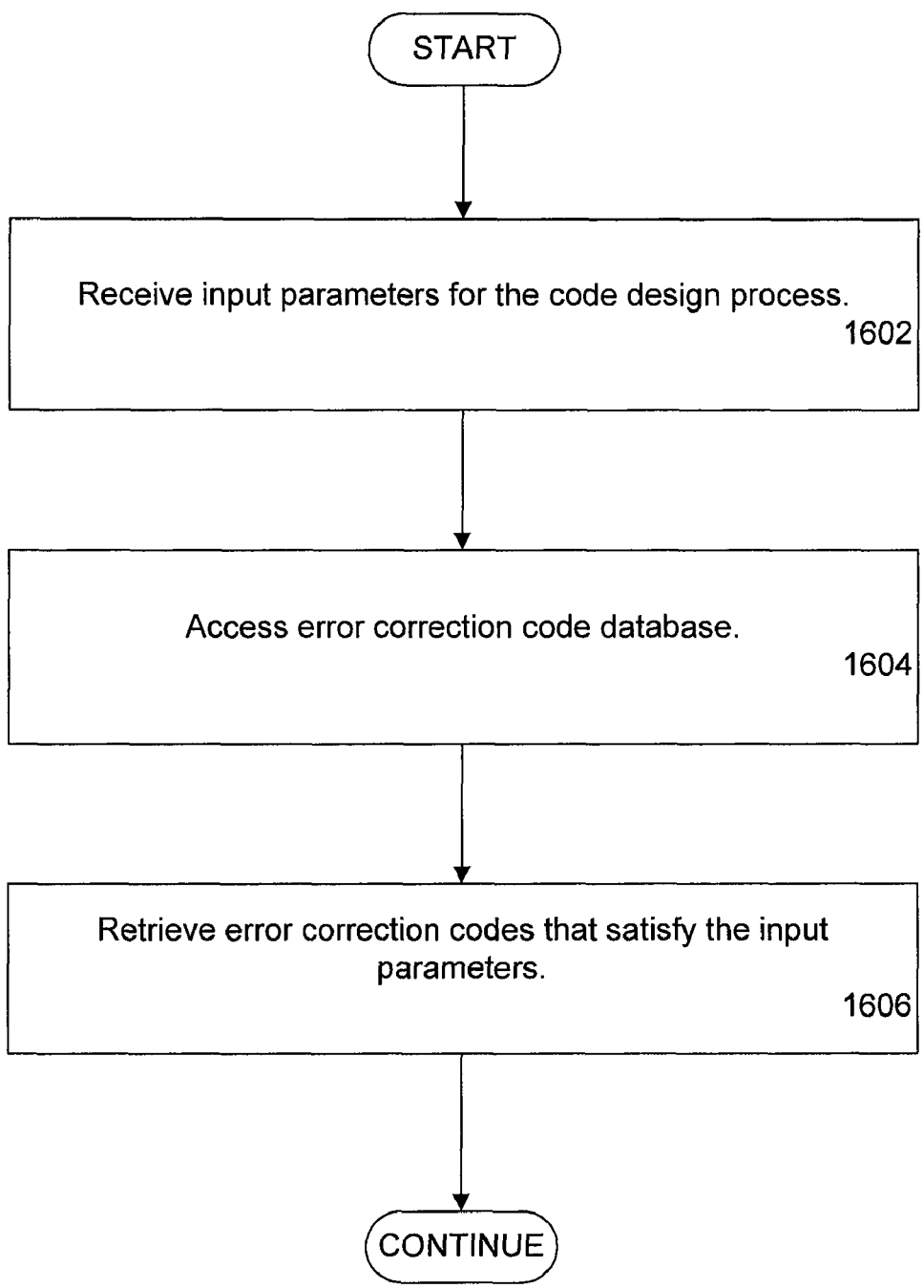
FIG. 16 is a flow diagram for computer operations to design an error correction code in accordance with the present invention.

FIG. 16 is a flow diagram of operations performed by a software application program executing on a computer system as described above to identify suitable error correcting codes $\Sigma$ and C in accordance with the present invention. In the first operation, represented by the flow diagram box numbered 1602, the computer system receives input parameters for the code design process. The parameters will include the desired t and t parameters. Additional parameters may be solicited or calculated by the computer system. For example, if the computer system is to be utilized for code selection in the case where overshoot on memory programming will be tolerated (see the Speed Up discussion above in Section VIII), a more robust code may be desired. One means of providing a more robust (stronger) code is to adjust the value of t, either by the user before providing the input parameter to the system or automatically by the system after user input of t and upon identification of the overshoot option. For a more robust code, the system may adjust the value of t by an adjustment factor.

Once the code parameters have been set, the system may consult a database of error correction codes. The database may be maintained by the computer system internally, or with attached storage, or the database may be maintained elsewhere by another computer system such that the design application computer system accesses the database by network communications with the database computer system. The error correction code access operation is represented in FIG. 16 by the box numbered 1604.

After the code database has been accessed, the computer system will retrieve those error correction codes that satisfy the code selection parameters. The codes themselves may be retrieved, or identification information sufficient to specify the codes may be retrieved. The retrieved error correction codes that satisfy the input parameters will then be presented to the user, as indicated at box 1606. The user can then make an error correction code selection for a memory device under design. The software application that performs the operations of FIG. 16 may be implemented as a dedicated application, or the operations of FIG. 16 may be incorporated into an application that provides other operations. Thus, the operations for selection of error correcting codes that are constructed in accordance with the invention may be incorporated into other memory device design application software, or may be provided in dedicated code selection application software.

The present invention has been described above in terms of presently preferred embodiments so that an understanding of the present invention can be conveyed. There are, however, many configurations and techniques for coding schemes not specifically described herein, but with which the present invention is applicable. The present invention should therefore not be seen as limited to particular embodiments described herein, but rather it should be understood that the present invention has wide applicability with respect to coding schemes for correcting errors. All modifications, variations, or equivalent arrangements and implementations that are within the scope of the attached claims should therefore be considered within the scope of the invention.

We claim:

1. A method of processing an encoded data value comprising a codeword received over an information channel, the method comprising:

receiving a channel output y comprising symbols defined over an alphabet Q of size q;

performing symbol recovery of the channel output y to obtain a word of symbols $\psi$ over an alphabet Q' of size q' wherein q>q' for an error correcting code $\Sigma$ defined over Q' and adapted to correct for up to t asymmetric l-limited magnitude errors;

decoding the word of symbols $\psi$ with the error correcting code $\Sigma$ and obtaining a decoded estimate $\hat{\chi}$ and an error-word estimate comprising a word of symbols $\hat{\in}$ over Q' such that $\psi=\hat{\chi}+\hat{\in}$ mod q'; and combining the channel output y with the error-word estimate $\hat{\in}$ and thereby producing the estimated codeword of the data value over the alphabet Q.

2. A method as in claim 1, wherein the received codeword is from an error correcting code C such that C is defined by $$C=\{x=(x_1, x_2, \ldots, x_n)\in Q^n: x \bmod q'\in\Sigma\}.$$

3. A method as in claim 1, wherein q'=l+1 and Σ is adapted to correct symmetric errors and the received codeword is from an error correcting code C such that C is defined by $$C=\{x=(x_1, x_2, \ldots, x_n) \in Q^n : x \bmod (l+1) \in \Sigma\}.$$

4. A method as in claim 1, wherein performing symbol recovery comprises performing symbol recovery with a symbol-wise modulo q' of the channel output y.

5. A method as in claim 4, wherein Σ corrects t symmetric errors and performing symbol recovery comprises a modulo (l+1) operation.

6. A method as in claim 1, wherein Σ is a systematic code and the channel output y comprises a data value encoded with Σ, and decoding comprises decoding with a decoder for a predetermined number of symbols in a codeword block array.

7. A method as in claim 6, wherein the codeword block array is arranged such that columns of the array contain either parity data or user information.

8. A method as in claim 6, wherein the decoder comprises a Hamming decoder.

9. A method as in claim 6, wherein the decoder comprises a BCH decoder.

10. A method as in claim 6, wherein the decoder comprises a Reed-Solomon decoder.

11. A method as in claim 1, wherein the information channel comprises a Flash memory channel.

12. A method as in claim 1, further comprising:
establishing an initial level and a target level of a physical quantity, wherein the target level corresponds to a codeword of an error correcting code;
providing a programming pulse sequence comprising at least one programming pulse, wherein a first pulse increases the physical quantity from the initial level to a next level that is closer to the target level than the initial level, and wherein subsequent pulses adjust the physical quantity toward the target level;
terminating the programming pulse sequence at a terminating level when pulse sequence parameters are satisfied; and
correcting errors for adjusting the physical quantity from the approximate target level to the target level of the codeword.

13. A method as in claim 12, wherein the terminating level is greater than the target level.

14. A data device that stores data for retrieval, the data device comprising:
a host interface that provides communications between the data device and a host device;
a memory interface that provides communications between memory cells and the data device;
a microcontroller that manages communications for data transfer between the host interface and the memory interface, comprising an information channel, wherein the microcontroller processes an encoded data value comprising a codeword and performs operations such that the microcontroller
receives a channel output y comprising symbols defined over an alphabet Q of size q;
performs symbol recovery of the channel output y to obtain a word of symbols ψ over an alphabet Q' of size q' wherein q>q' for an error correcting code Σ defined over Q' and adapted to correct for up to t asymmetric l-limited magnitude errors;
decodes the word of symbols ψ with the error correcting code Σ and obtains a decoded estimate $\hat{\chi}$ and an error-word estimate comprising a word of symbols $\hat{\varepsilon}$ over Q' such that $\psi = \hat{\chi} + \hat{\varepsilon} \bmod q'$; and
combines the channel output y with the error-word estimate $\hat{\varepsilon}$ and thereby produces the estimated codeword of the data value over the alphabet Q.

15. A data device as in claim 14, wherein the received codeword is from an error correcting code C such that C is defined by $$C=\{x=(x_1, x_2, \ldots, x_n) \in Q^n : x \bmod q' \in E\}.$$

16. A data device as in claim 14, wherein q'=l+1 and Σ is adapted to correct symmetric errors, and the received codeword is from an error correcting code C such that C is defined by $$C=\{x=(x_1, x_2, \ldots, x_n) \in Q^n : x \bmod (l+1) \in \Sigma\}.$$

17. A data device as in claim 14, wherein the microcontroller performs symbol recovery with a symbol-wise modulo q' of the channel output y.

18. A data device as in claim 17, wherein Σ corrects t symmetric errors and symbol recovery comprises a modulo (l+1) operation.

19. A data device as in claim 14, wherein Σ is a systematic code and the channel output y comprises a data value encoded with Σ, and decoding comprises decoding with a decoder for a predetermined number of symbols in a codeword block array.

20. A data device as in claim 19, wherein the codeword block array is arranged such that columns of the array contain either parity data or user information.

21. A data device as in claim 19, wherein the decoder comprises a Hamming decoder.

22. A data device as in claim 19, wherein the decoder comprises a BCH decoder.

23. A data device as in claim 19, wherein the decoder comprises a Reed Solomon decoder.

24. A data device as in claim 14, wherein the information channel comprises a Flash memory channel.

25. A data device as in claim 14, wherein the microcontroller performs operations further comprising:
establishing an initial level and a target level of a physical quantity, wherein the target level corresponds to a codeword of an error correcting code;
providing a programming pulse sequence comprising at least one programming pulse, wherein a first pulse increases the physical quantity from the initial level to a next level that is closer to the target level than the initial level, and wherein subsequent pulses adjust the physical quantity toward the target level;
terminating the programming pulse sequence at a terminating level when pulse sequence parameters are satisfied; and
correcting limited magnitude asymmetric errors for adjusting the physical quantity from the terminating level to the target level of the codeword.

26. A data device as in claim 25, wherein the terminating level is greater than the target level.

27. A method for run time programming of a data device to reach a target level of a physical quantity in memory cells of the data device, the method comprising:
establishing an initial level and the target level of the physical quantity, wherein the target level corresponds to a codeword of an error correcting code;
providing a programming pulse sequence comprising at least one pulse, wherein a first pulse increases the physical quantity from the initial level to a next level which is closer to the target level than the initial level, and subsequent pulses adjust the physical quantity toward the target level;
terminating the programming pulse sequence at a terminating level when pulse sequence parameters are satisfied;

applying error correction and adjusting the physical quantity from the terminating level to the target level for the codeword;

wherein providing a programming pulse sequence comprises applying a predetermined number of pulses at the conclusion of which the terminating level is reached; and wherein the predetermined number of pulses is selected in accordance with a desired number N, given by $$N = \frac{\log(I_F - I_0) - \log(\Delta)}{-\log(1 - K_\in)},$$

where the initial physical quantity level is given by $I_i$ and the target level is given by $I_F$ and $\Delta$ corresponds to a desired error margin and $K_\in \Delta -1/\ln(\in)$.

28. A method as in claim 27, wherein applying error correction is performed at an access operation to obtain the codeword from the data device.

29. A method as in claim 27, wherein applying error correction is performed in a background operation independently of obtaining a codeword from the data device.

30. A method as in claim 27, wherein the pulse sequence parameters are such that the terminating level of the physical quantity is greater than the target level.

31. A method as in claim 30, wherein applying error correction is performed at an access operation to obtain the codeword from the data device.

32. A method as in claim 30, wherein applying error correction is performed in a background operation independently of obtaining a codeword from the data device.

33. A method as in claim 27, wherein the codeword comprises an encoded data value as a channel output y defined over an alphabet Q of size q, and applying error correction comprises a decoding operation that:

performs symbol recovery of the channel output y to obtain a word of symbols ψ over an alphabet Q' of size q' wherein q>q' for an error correcting code Σ defined over Q' and adapted to correct for up to t asymmetric l-limited magnitude errors;

decodes the word of symbols ψ with the error correcting code Σ and obtains a decoded estimate $\hat{\chi}$ and an error-word estimate comprising a word of symbols $\hat{\in}$ over Q' such that ψ=$\hat{\chi}$+$\hat{\in}$ mod q'; and combines the channel output y with the error-word estimate $\hat{\in}$ and thereby produces the estimated codeword of the data value over the alphabet Q.

34. A method as in claim 33, wherein the received codeword is defined over an error correcting code C such that C is defined by $$C=\{x=(x_1, x_2, \ldots, x_n) \in Q'^n : x \bmod q' \in \Sigma\}.$$

35. A method as in claim 33, wherein q'=l+1 and Σ is adapted to correct t symmetric errors and the received codeword is defined over an error correcting code C such that C is defined by $$C=\{x=(x_1, x_2, \ldots, x_n) \in Q'^n : x \bmod(l+1) \in \Sigma\}.$$

36. A method as in claim 33, wherein symbol recovery is performed with a symbol-wise modulo q' of the channel output y.

37. A method as in claim 36, wherein Σ corrects t symmetric errors and performing symbol recovery comprises a modulo (l+1) operation.

38. A method as in claim 33, wherein Σ is a systematic code and the channel output y comprises a data value encoded with Σ, and decoding comprises decoding with a decoder for a predetermined number of symbols in a codeword block array.

39. A method as in claim 38, wherein the codeword block array is arranged such that columns contain either parity data or user information.

40. A method as in claim 38, wherein the decoder comprises a Hamming decoder.

41. A method as in claim 38, wherein the decoder comprises a BCH decoder.

42. A method as in claim 38, wherein the decoder comprises a Reed-Solomon decoder.

43. A method as in claim 33, wherein the information channel comprises a Flash memory channel.

44. A method as in claim 27, wherein the error correction for the error from the terminating level to the target level and any channel error introduced by reading a value from memory cells of the data device are corrected in a single error correction operation.

45. A method as in claim 44, wherein the memory cell value read from the data device comprises an encoded data value as a channel output y, such that the channel output y is defined over an alphabet Q of size q, and applying error correction comprises a decoding operation that:

performs symbol recovery of the channel output y to obtain a word of symbols ψ over an alphabet Q' of size q' wherein q>q' for an error correcting code Σ defined over Q' and adapted to correct for up to t asymmetric l-limited magnitude errors;

decodes the word of symbols ψ with the error correcting code Σ and obtains a decoded estimate $\hat{\chi}$ and an error-word estimate comprising a word of symbols $\hat{\in}$ over Q' such that ψ=$\hat{\chi}$+$\hat{\in}$ mod q'; and combines the channel output y with the error-word estimate $\hat{\in}$ and thereby produces the estimated codeword of the data value over the alphabet Q.

46. A computer implemented method for error correction code design, the method comprising:

receiving input parameters at a computer from a computer user for the error correction code design, the input parameters including values t and l, wherein l specifies a maximum magnitude of asymmetric errors in a codeword to be corrected by the error correction code and t specifies a maximum number of the l-limited magnitude asymmetric errors in a codeword;

accessing, at the computer, an error correction code database containing error correction codes, and determining error correction codes that satisfy the input parameters; and retrieving, at the computer, database information that identifies the determined error correction codes that satisfy the input parameters and providing the information to the user;

wherein the designed error correction code is sufficient for processing an encoded data value comprising a codeword received over an information channel, the codeword processing with the code comprising:

receiving a channel output y comprising symbols defined over an alphabet Q of size q;

performing symbol recovery of the channel output y to obtain a word of symbols ψ over an alphabet Q' of size q' wherein q>q' for an error correcting code Σ defined over Q' and adapted to correct for up to t asymmetric l-limited magnitude errors;

decoding the word of symbols ψ with the error correcting code Σ and obtaining a decoded estimate $\hat{\chi}$ and an error-word estimate comprising a word of symbols $\hat{\in}$ over Q' such that ψ=$\hat{\chi}$+$\hat{\in}$ mod q'; and combining the channel output y with the error-word estimate $\hat{\mathcal{E}}$ and thereby producing the estimated codeword of the data value over the alphabet Q.

47. A method as in claim 46, wherein the received codeword is defined over an error correcting code C such that C is defined by $$C=\{x=(x_1, x_2, \ldots, x_n)\in Q^n : x \bmod q' \in \Sigma\}.$$

48. A method as in claim 46, wherein q'=l+1 and $\Sigma$ is adapted to correct symmetric errors and the received codeword is defined over an error correcting code C such that C is defined by $$C=\{x=(x_1, x_2, \ldots, x_n)\in Q^n : x \bmod (l+1) \in \Sigma\}.$$

49. A method as in claim 46, wherein performing symbol recovery comprises performing symbol recovery with a symbol-wise modulo q' of the channel output y.

50. A method as in claim 49, wherein $\Sigma$ corrects t symmetric errors and performing symbol recovery comprises a modulo (l+1) operation.

51. A method as in claim 46, wherein $\Sigma$ is a systematic code and the channel output y comprises a data value encoded with $\Sigma$, and decoding comprises decoding with a decoder for a predetermined number of symbols in a codeword block array.

52. A method as in claim 51, wherein the codeword block array is arranged such that columns of the array contain either parity data or user information.

53. A method as in claim 51, wherein the decoder comprises a Hamming decoder.

54. A method as in claim 51, wherein the decoder comprises a BCH decoder.

55. A method as in claim 51, wherein the decoder comprises a Reed-Solomon decoder.

56. A method as in claim 46, wherein the information channel comprises a Flash memory channel.

57. A method of encoding a data value comprising user information for transmission over an information channel, the method comprising:
   providing the data value to an encoder utilizing an error correcting code defined over a code alphabet and producing an encoder output X value;
   combining the X value and the data value and producing the encoded data value comprising a codeword of a code C over an alphabet larger than the $\Sigma$ alphabet;
   wherein the encoded data value further comprises a symbol defined over an alphabet Q of size q, such that the symbol can be recovered by performing symbol recovery of the channel output y to obtain a word of symbols $\psi$ over an alphabet Q' of size q' wherein q>q' for an error correcting code $\Sigma$ defined over Q' and adapted to correct for up to t asymmetric l-limited magnitude errors, followed by decoding the word of symbols $\psi$ with the error correcting code $\Sigma$ and obtaining a decoded estimate $\hat{\chi}$ and an error-word estimate comprising a word of symbols $\hat{\mathcal{E}}$ over Q' such that $\psi=\hat{\chi}+\hat{\mathcal{E}} \bmod q'$; and combining the channel output y with the error-word estimate $\hat{\mathcal{E}}$ and thereby producing the estimated codeword of the data value over the alphabet Q.

58. A method as in claim 57, wherein the output value X comprises the data value with additional parity information.

59. An encoder for encoding a data value comprising user information for transmission over an information channel, the encoder comprising:
   a $\Sigma$ encoder utilizing a code defined over a code alphabet, wherein the encoder produces an encoder output X value;
   a combiner that combines the X value and the data value and produces the encoded data value comprising a codeword of a code C over an alphabet larger than the $\Sigma$ alphabet;
   wherein the encoded data value further comprises a symbol defined over an alphabet Q of size q, such that the symbol can be recovered by performing symbol recovery of the channel output y to obtain a word of symbols $\psi$ over an alphabet Q' of size q' wherein q>q' for an error correcting code $\Sigma$ defined over Q' and adapted to correct for up to t asymmetric l-limited magnitude errors, followed by decoding the word of symbols $\psi$ with the error correcting code $\Sigma$ and obtaining a decoded estimate $\hat{\chi}$ and an error-word estimate comprising a word of symbols $\hat{\mathcal{E}}$ over Q' such that $\psi=\hat{\chi}+\hat{\mathcal{E}} \bmod q'$; and combining the channel output y with the error-word estimate $\hat{\mathcal{E}}$ and thereby producing the estimated codeword of the data value over the alphabet Q.

\* \* \* \* \*